US007158644B2

(12) United States Patent
Kakuhari et al.

(10) Patent No.: US 7,158,644 B2
(45) Date of Patent: Jan. 2, 2007

(54) ACTIVE NOISE CONTROL SYSTEM

(75) Inventors: Isao Kakuhari, Ikoma (JP); Kenichi Terai, Sijyonawate (JP); Hiroyuki Hashimoto, Ibaraki (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 954 days.

(21) Appl. No.: 10/007,674

(22) Filed: Dec. 10, 2001

(65) Prior Publication Data

US 2002/0080978 A1 Jun. 27, 2002

(30) Foreign Application Priority Data

Dec. 15, 2000 (JP) ............................ 2000-381490

(51) Int. Cl.
*H03B 29/00* (2006.01)

(52) U.S. Cl. ..................................................... 381/71.5

(58) Field of Classification Search ............... 381/71.5; 415/118

See application file for complete search history.

(56) References Cited

U.S. PATENT DOCUMENTS

| | | | | |
|---|---|---|---|---|
| 3,821,999 A * | 7/1974 | Guess et al. | ................ | 181/296 |
| 5,606,622 A * | 2/1997 | Christenson | ............... | 381/71.5 |
| 6,201,872 B1 * | 3/2001 | Hersh et al. | ............... | 381/71.5 |
| 2002/0009202 A1 * | 1/2002 | Sheplak et al. | ............ | 381/71.5 |
| 2003/0053635 A1 * | 3/2003 | Carme et al. | .............. | 381/71.5 |

FOREIGN PATENT DOCUMENTS

| | | | |
|---|---|---|---|
| JP | 61-296392 | A | 12/1986 |
| JP | 62-1156 | A | 1/1987 |
| JP | 62-206212 | A | 9/1987 |
| JP | 5-188976 | A | 7/1993 |
| JP | 9-89356 | A | 4/1997 |
| JP | 10-39878 | A | 2/1998 |
| JP | 1039877 | A | 2/1998 |

* cited by examiner

*Primary Examiner*—Brian T. Pendleton
(74) *Attorney, Agent, or Firm*—Smith Patent Office

(57) ABSTRACT

A first rectifying net, a rectifying grid and a second rectifying net are attached, as a rectifying part upstream of a duct through which air for cooling flows. A noise detection microphone detects noise within the duct. An error detection microphone is placed in the downstream side of the noise to detect error noise. An arithmetic circuit inputs a noise signal of the noise detection microphone, carries out an arithmetic of a transfer function so that an output signal of the error detection microphone becomes minimum, and outputs a control signal to a control sound source. The control sound source radiates a control sound having approximately the same sound pressure as and an opposite phase of the noise within the duct. Thus, the coherence between the noise in the upstream and downstream parts increases, thereby enhancing a sound-muffling effect.

8 Claims, 23 Drawing Sheets

ACTIVE NOISE CONTROL SYSTEM

BACKGROUND OF THE INVENTION

1. Field of the Invention

The present invention relates to an active noise control system for reducing noise generated in a duct for a fluid.

2. Description of the Related Art

Together with the increased density of today's residential and labor environments, cases in which noise sources such as air conditioning equipment and office equipment and residential spaces are in proximity to each other have increased. Up to the present, the muffling or the cut off of noise has been effectuated by making the distance between noise sources and people great. In addition, noise has been attenuated by installing a sound absorbing material. In such environments, however, it has been difficult to carry out above described measures.

Since noise in residential spaces is increased in the above manner, an amelioration of this situation is required. In addition, office equipment is provided with cooling fans and ducts for exhaust or for induction in order to cool down the heat emitting parts in the equipment. In this case, exhaust noise or induction noise for cooling is often annoying.

As for a general measure in order to reduce noise generated in a duct, there is a method for carrying out noise absorption processing by attaching a noise absorbing material on the inside wall of the duct. In addition, there is a method of reducing noise propagating through a duct by attaching a sound reducing muffler or a sound reducing chamber to an apparatus which emits a large amount of exhaust, such as an engine. There is a problem, however, that a large volume duct is required for reducing noise of a frequency of 1 kHz or less by means of these methods.

On the other hand, as for a method of reducing noise having low frequency bands without increasing the length or the volume of a duct, there is the proposal of introducing active noise control applied to an air conditioning duct. For example, there is the method as disclosed in Japanese unexamined patent publication S61-296392 (1986) or Japanese unexamined patent publication S62-1156 (1987). According to this method, a duct 1 is provided where a fluid A flows in the direction of Z and a noise B is propagated in the same direction as shown in FIG. 1. A noise detection microphone 2 is attached upstream in this duct 1 while a control sound source 4 and an error detection microphone 3 are attached downstream in this duct 1. Then, based on a reference signal from the noise detection microphone 2 and a residual signal from the error detection microphone 3, a control signal is generated by using an active noise control algorithm and a control sound is emitted from the control sound source 4 so that the residual signal becomes smaller.

In order to obtain a sufficient noise reduction effect by carrying out active noise control as described above, however, it is necessary that a sufficient coherence exists between the reference signal of the noise detection microphone 2 and the residual signal of the error detection microphone 3.

In addition, there is a method disclosed in Japanese unexamined patent publication S62-206212 (1987). According to this method, as shown in FIG. 2, a duct 5 is provided where a fluid A flows in the direction of Z and a noise B is propagated in the same direction. A first detection microphone 6 is attached upstream in this duct 5 while a second detection microphone 7 is attached at a distance b from the position of the first detection microphone 6, which is at a position downstream. A control sound source 8 is attached at a distance L (L>b) from the position of the first detection microphone 6, which is at a position downstream and which is outside of the duct 5. Then a signal from the first detection microphone 6 and a signal gained by carrying out delay processing on the second detection microphone 7 are synthesized so as to generate a control signal. Then, this control signal is given to a control sound source 8 and a control sound of which the phase is opposite to that of the noise is emitted and, whereby, noise control is carried out such that no howling is caused and that is in accordance with the propagation speed of the noise. In this method, it is also necessary that a sufficient coherence exists between the signal from the first detection microphone 6 and the signal from the second detection microphone 7.

FIG. 3 is a characteristics graph showing the relationship between the coherence $\gamma$ between the noise detection microphone and the error detection microphone and an estimated reduction effect R which corresponds to the maximum noise amount reduced by active noise control. In the case that the coherence is 0.8 or more, the maximum noise reduction amount increase greatly. In order to obtain the sufficient noise reduction effect by means of active noise control as shown in FIG. 3, a high value of coherence is necessary. Due to the generation of disturbance, swirl or rotating flow within the duct, however, the coherence value between the two points is lowered. That is to say, the noise detection microphone and the error detection microphone detect not only a pressure fluctuation due to noise but also detect a pressure fluctuation due to disturbance, swirl, rotating flow or the like, so that the coherence value between the two microphones is lowered.

As for a method of solving this problem, a method of improving the coherence by rectifying the flow of fluid in a duct is proposed in Japanese unexamined patent publication H5-188976 (1993). For example, as shown in FIG. 4, a duct 9 is provided for expelling or for sending fluid A in the direction of Z. An air blower is provided upstream in this duct 9 and the case where this air blower functions as a noise source 10 is considered in the following. The fan of this air blower rotates, so that the fluid A and noise B flow in the direction of Z.

A noise detection microphone 11 is attached midstream within the duct 9 in the same manner as in the above described examples and a control sound source 12 and an error detection microphone 13 are attached, in this order, downstream within the duct 9. Then, an arithmetic circuit 14 is provided for generating a control signal based on a reference signal from the noise detection microphone 11 and a residual signal from the error detection microphone 13. In addition, a rectifying member 15A having a net form or a rectifying member 15B having a honeycomb form is inserted in the area downstream from the noise source 10 which is the area upstream to the noise detection microphone 11. Thus, air disturbance factors caused by the fan of the air blower are rectified in flow by rectifying member 15A or 15B. Thus, the coherence is improved between the different positions of the microphones downstream from the rectifying member.

In addition, there is a method disclosed in Japanese unexamined patent publication H9-89356 (1997). As shown in FIG. 5, a duct 16 in which fluid A and noise B are propagated in the direction of Z is provided. A noise detection microphone 17, a control sound source 18, an error detection microphone 19 and an arithmetic circuit 20 are provided in the same manner as in FIG. 4 and a metal net 21 is inserted in the area upstream to the noise detection microphone 17. The disturbance speed of the fluid A is attenuated by this metal net 21, so that an improvement in coherence is achieved.

In addition, in the case that the structure of the duct is complicated, there is a method of reducing noise of the fluid without using active noise control as described above by modifying the inside of the duct. As an example of this, the methods disclosed in Japanese unexamined patent publication H10-9877 (1998) and Japanese unexamined patent publication H10-39878 (1998) are shown in FIG. 6. Here, the case is considered: the bent portions of the duct 21 are formed of curved face walls 22*a* and 22*b*, so that the space surrounded by the curved face walls 22*a* and 22*b* is used as an air duct. In such a case, a rectifying plate 23 approximately parallel to the curved face walls is provided in the central part of the air duct. In addition, sound absorbing material is attached to the curved face walls 22*a* and 22*b* and to the surface of the rectifying plate 23. In such a structure, the disturbance factors or swirl factors of the air within the duct 21 are rectified when the air is expelled or transferred by an air blower 24. In this case, it is considered that the duct 21 itself has a rectifying part.

In active noise control systems provided for a duct in structures as described above, however, there are problem points as follows. That is to say, it is necessary in a variety of apparatuses that are equipped with active noise control systems, to further miniaturize air cooling ducts in order to achieve miniaturization of the apparatuses. In addition, there are cases where a plurality of heat emitting sources are provided in the apparatuses or air for cooling is supplied from a plurality of positions to the heat emitting sources. In these cases, it occurs necessity to bend the ducts, and to provide a plurality of ducts so as to merge them or to branch the ducts. In such cases, the forms of the ducts become complicated in comparison with the cases shown in FIGS. 1 to 5.

That is to say, in the case of ducts having a simple structure, air utilized for air conditioning can be rectified according to the above-described conventional measures and active noise control can be carried out by utilizing the coherence between the noise detection microphone and the error detection microphone, thereby obtaining the noise reduction effect. In the case that of ducts having complicated forms, however, sufficient active noise control cannot be carried out according to the above described conventional measures.

SUMMARY OF THE INVENTION

A purpose of the present invention is to implement an active noise control system for obtaining a sufficient noise reduction effect, even in an apparatus having ducts that expel or absorb fluid in complicated forms, without increasing the size of the apparatus having the noise source.

An active noise control system according to the present invention is provided with a noise detector for detecting noise in a duct where a fluid flows and an error detector provided in a downstream side of the noise to detect an error sound. In addition, a control sound source is installed in the vicinity of the error detector and a control sound having approximately the same sound pressure as of and an opposite phase to the noise within the duct is radiated. At this time, a noise signal of the noise detector and an error signal of the error detector are inputted to an arithmetic circuit and a transfer function is set so that the error signal becomes small. Furthermore, a fluid within the duct is rectified or made into a laminar flow by providing a rectifying part in the upstream side of the fluid that flows within the duct. The rectifying part is composed of several kinds of rectifying members. The arithmetic circuit multiplies the noise signal with the transfer function so as to output the multiplication result to the control sound source as a control signal. When such a control is carried out, even in the case the form of the duct is complicated and compact, the coherence becomes high between the noise signal detected by the noise detector and the noise signal detected by the error detector, so that a control sound having an opposite phase to the noise can be precisely generated.

In addition, the active noise control system of the present invention is provided with a plurality of noise detectors and a plurality of error detectors and is constituted so that noise signals are added by using a first adder while error signals are added by using a second adder. When such added signals are given to the arithmetic circuit, the influence of the pressure fluctuation of the fluid can be further reduced so as to obtain a better noise reduction effect.

DETAILED DESCRIPTION OF THE PREFERRED EMBODIMENTS

Figure 1:
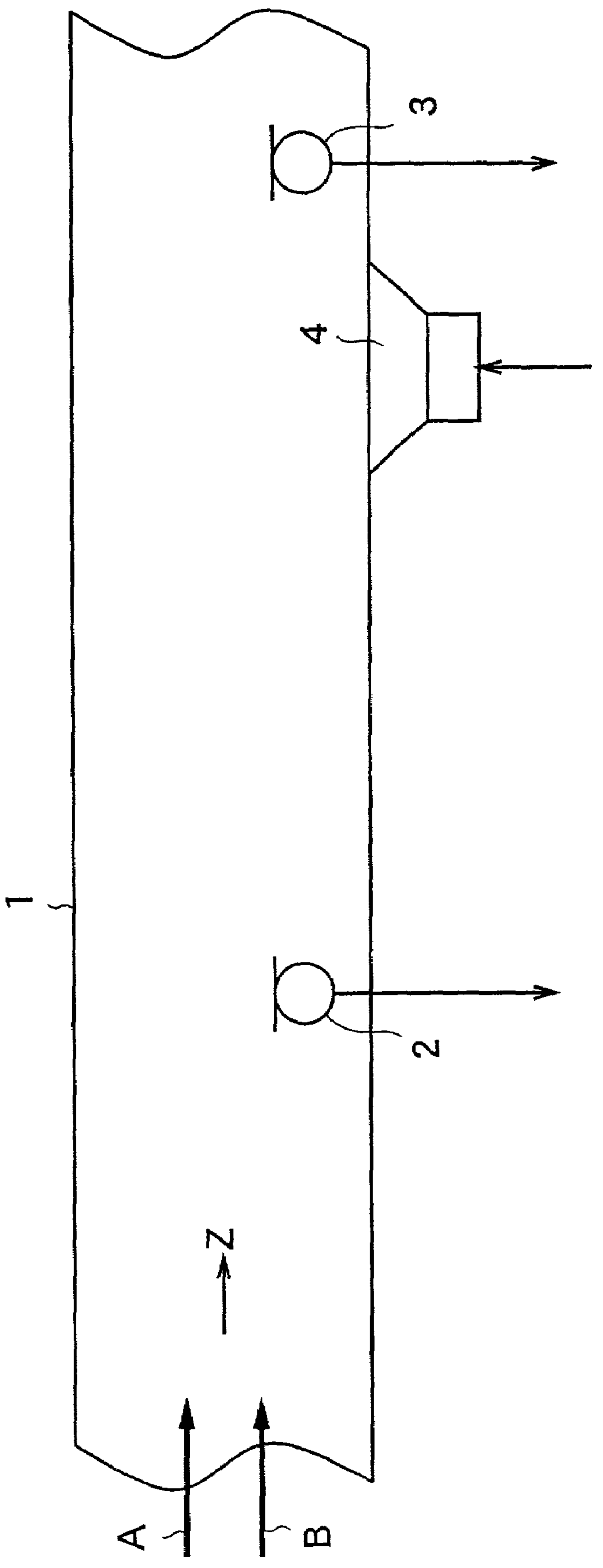
FIG. 1 (PRIOR ART)
FIG. 1 is a configuration diagram of an active noise control system carrying out electronic sound-muffling according to a prior art.
Figure 2:
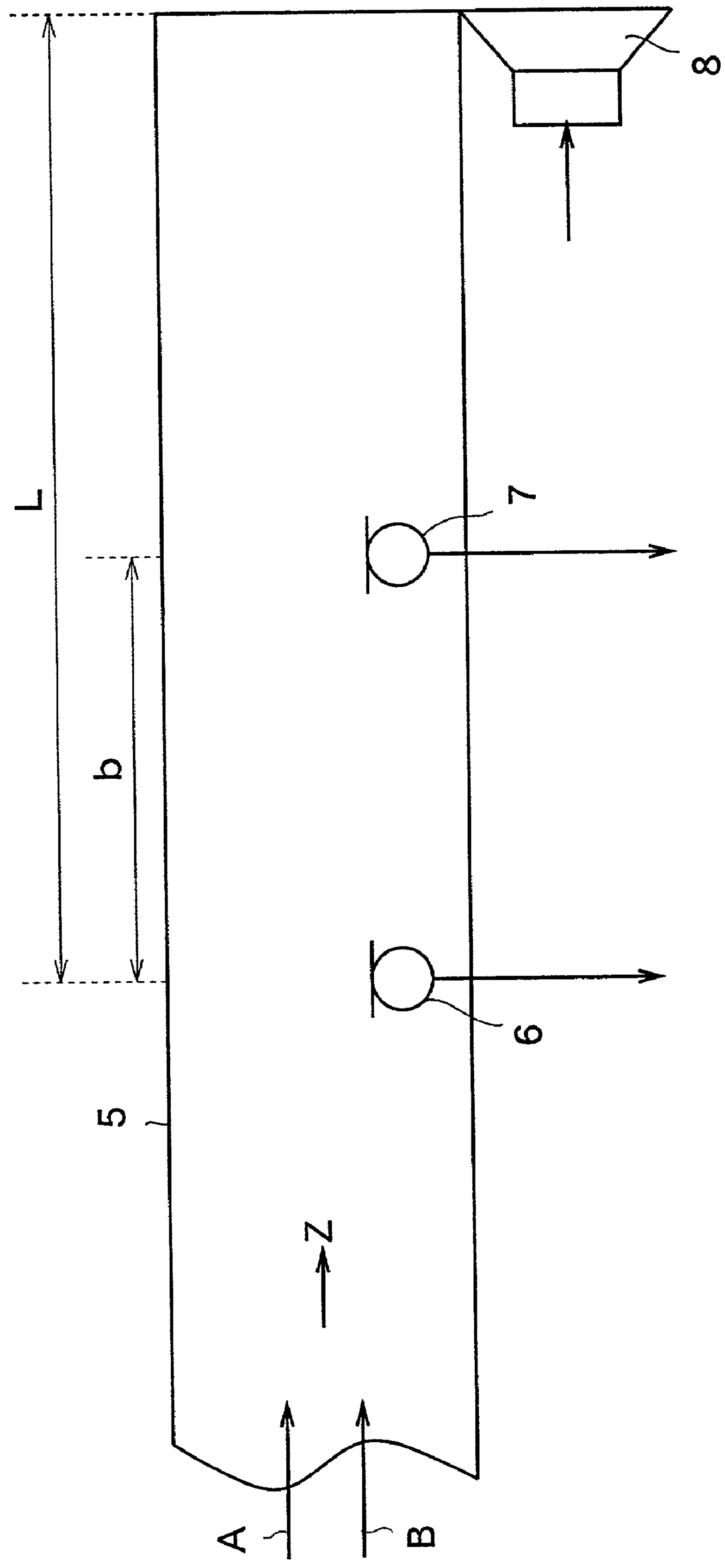
FIG. 2 (PRIOR ART)
FIG. 2 is a configuration view showing the main part of an active silencer according to a prior art.

An active noise control system according to embodiments of the present invention will be described in detail with reference to the drawings.

(First Embodiment)

The configuration of an active noise control system according to first embodiment of the present invention is described with reference to FIG. 7. A duct 30 is a duct for conveying (sending) a fluid A to the outside of the system. This duct 30 is different from a straight duct as shown in FIGS. 1, 2, 4 and 5 and a part of the duct having a complicated fluid path is shown and only a straight portion that allows the fluid A to flow in the direction of Z is represented. The duct of the present embodiment may, of course, be a duct of a structure such as in the prior arts. A noise B is propagated together with the fluid A in the direction of Z from the upstream of the duct 30. In the following description, the part shown in the figure is referred to as a duct 30.

The fluid A is air for air conditioning or for cooling and is supplied by a fan of a air blower which is not shown. Due to the rotation of this fan, rotational factors, disturbance factors, swirl factors and the like are added to the fluid A. Several kinds of rectifying members, such as a rectifying grid 32, a first rectifying net 33 and a second rectifying net 34 are attached upstream in this duct 30 to serve as a rectifying part 31. The rectifying grid 32, in which a number of small holes or capillaries having a form of a honeycomb shape, a circular shape or a rectangular shape in cross section are provided in the axial direction of the duct 30 (Z axis direction), has a function of adjusting the velocity vector of the fluid in the direction of the Z axis. In the present embodiment, a honeycomb material, of which the cell size is 3⁄16 inches, the opening ratio is 96% and the grid length is 100 mm, is used as an example of the rectifying grid.

The first rectifying net 33 and the second rectifying net 34 are nets having a predetermined opening ratio. As for rectifying nets, for example, nets having a wire diameter of 0.508 mm, the number of interstices of 10/inch and the opening ratio of 64% is used in the present embodiment. The rectifying nets have a function of making the velocity of the fluid A uniform in a perpendicular plane of the duct 30 by causing a pressure loss in the fluid A. Here, though nets of the same opening ratio are utilized for the first rectifying net 33 and for the second rectifying net 34, nets of differing opening ratios may be utilized. The smaller the opening ratio is, the greater the pressure loss in the fluid becomes.

Next, a noise detection microphone 35 is attached, as a noise detector, at a location upstream in the duct 30, which is a location immediately downstream of the second rectifying net 34. In addition, a control sound source 37 is attached downstream of the duct 30 and an error detection microphone 36 is attached in the vicinity thereof as an error detector. Then, an arithmetic circuit 38 is provided so as to generate a control signal based on a reference signal from the noise detection microphone 35 and on a residual signal from the error detection microphone 36.

The arithmetic circuit 38 generates a control signal by using an active noise control algorithm so that the residual signal becomes small at the error detection microphone 36. The control sound source 37 is a speaker that converts the control signal of the arithmetic circuit 38 into a control sound and that radiates the control sound downstream of the duct 30.

The operation of the active noise control system configured in this manner is described below. When the air blower which is not shown operates, noise is generated by the rotation of fan itself and parts within the system generate a wind blowing noise while air is being sent. Such noise is propagated to the exhaust side of the downstream through the duct 30. The control sound from the control sound source 37 is made to have an effect on the noise within the duct 30 so that the error noise thereof is detected by the error detection microphone 36 and an error signal is outputted to the arithmetic circuit 38. At the same time, the noise detection microphone 35 detects the noise within the duct 30 so as to output a noise signal to the arithmetic circuit 38. The arithmetic circuit 38 uses an LMS (least mean square) algorithm or the like so as to generate a control signal which is outputted to the control sound source 37, that allows the error signal which is correlated with the noise signal, to be small at all times.

A transfer function from the noise detection microphone 35 to the error detection microphone 36 via the duct 30 is assumed to be G while a transfer function from the control sound source 37 to the error detection microphone 36 is assumed to be C. When the arithmetic circuit 38 operates so as to set the transfer function thereof at −G/C, the output of the error detection microphone 36 approaches zero. When the noise in the noise detection microphone 35 is N, the noise in the error detection microphone 36 becomes N·G. The control sound generated by the control sound source 37 becomes as follows at the error detection microphone 36 part:

$$N\cdot(-G/C)\cdot C=-N\cdot G.$$

The noise N·G and the control sound (−N·G) interfere with each other at the error detection microphone 36 part so as to become as follows:

$$N\cdot G+(-N\cdot G)=0.$$

Accordingly, the noise level is lowered in the vicinity where the error detection microphone 36 is installed due to interference from noise and the control sound.

On the other hand, in the case that an error signal BN that is not correlated to the noise signal exists, the noise at the noise detection microphone 35 becomes as follows:

$$N \cdot G + BN.$$

The arithmetic circuit 38 cannot generate a control signal that makes smaller an error signal that is not correlated to the noise signal. Accordingly, residual noise at the error detection microphone 36 becomes as follows:

$$N \cdot G + BN + (-N \cdot G) = BN.$$

Figure 3:
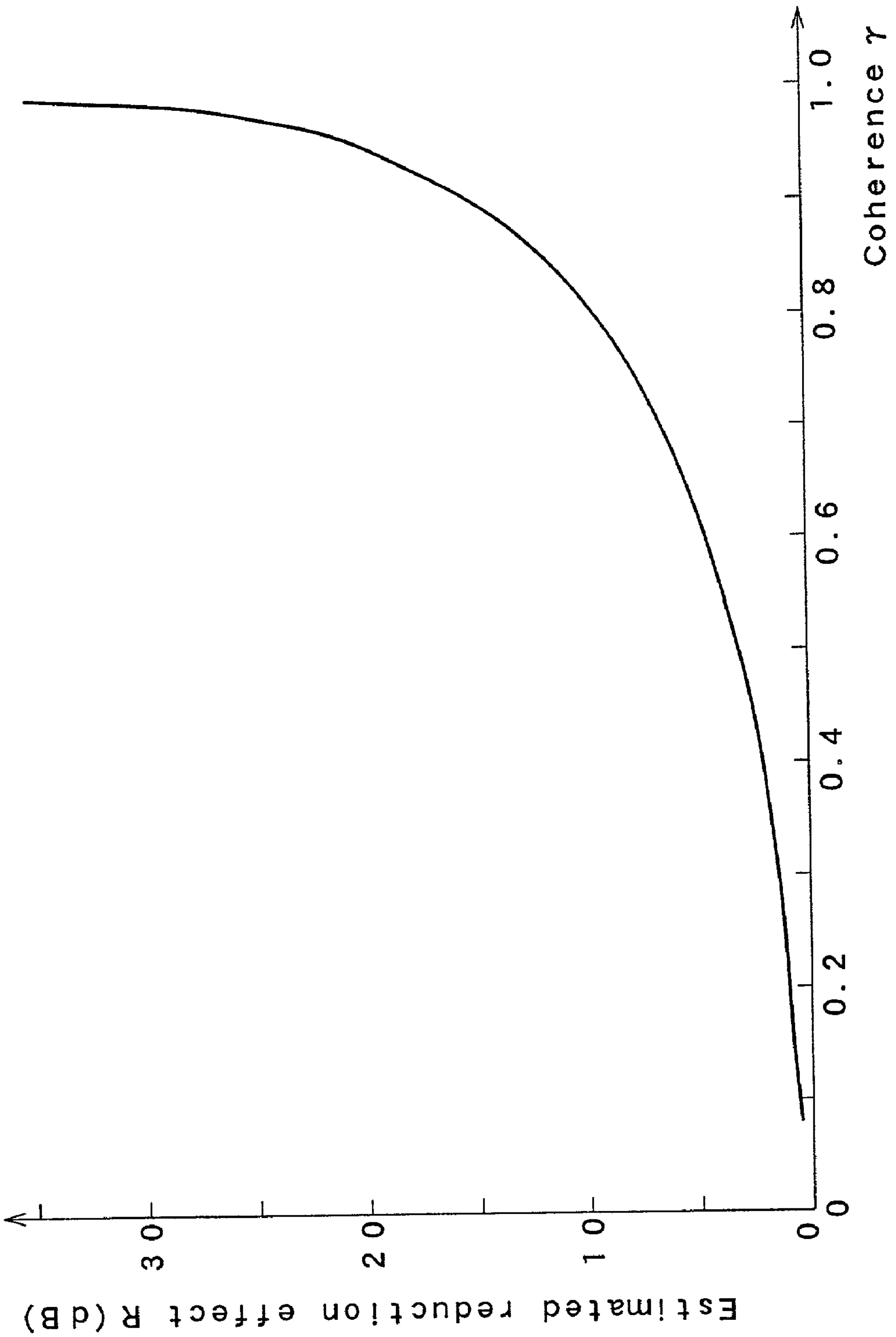
FIG. 3 is a characteristics graph showing the relationship between the coherence and the maximum reduction amount with respect to the coherence between the noise signal and the error signal.

Correlations between a noise signal and an error signal can, in general, be digitized. As shown in FIG. 3, it is understood that the noise reduction effect becomes greater by allowing the correlation, that is to say the coherence $\gamma$, to have a large value. The cause of the lowering of the coherence between the noise signal of the noise detection microphone 35 and the error signal of the error detection microphone 36 in the noise within the duct 30 is due to the pressure fluctuation caused by disturbance, swirl, rotating flow or the like of the fluid. Accordingly, the coherence can be increased by rectifying the fluid.

Figure 8:
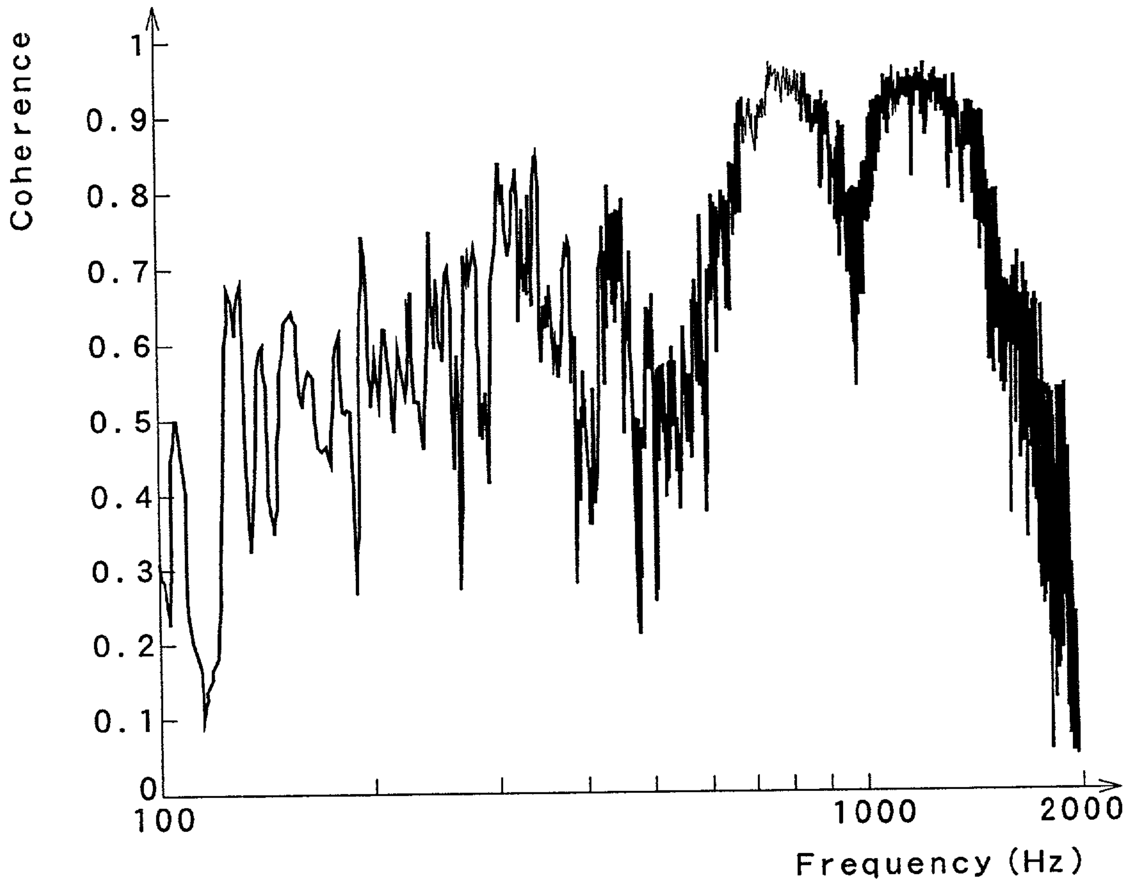
FIG. 8 is a frequency characteristics graph of the coherence between the noise signal and the error signal in a duct in the case where no rectifying measure is carried out.
Figure 9:
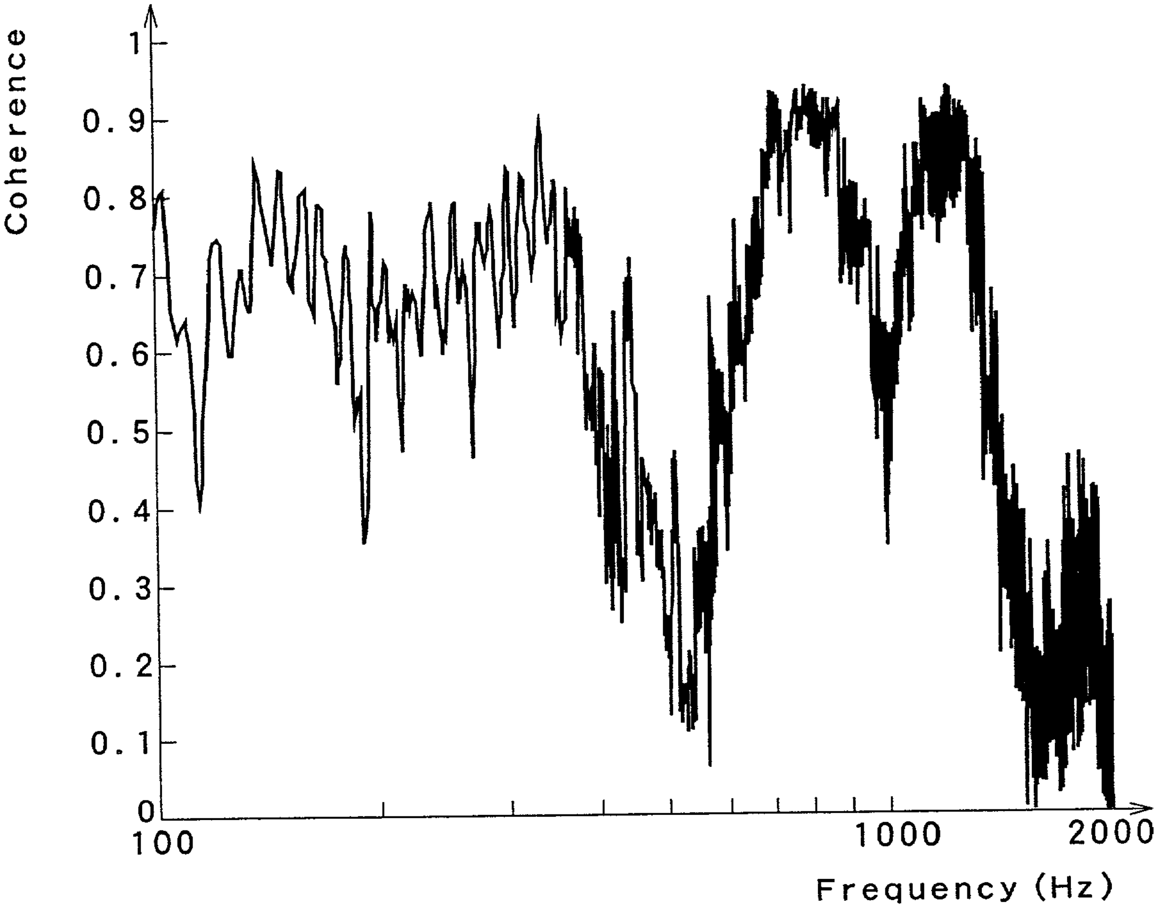
FIG. 9 is a frequency characteristics graph of the coherence between the noise signal and the error signal in a duct in the case where a rectifying measure (part 1) is carried out.
Figure 10:
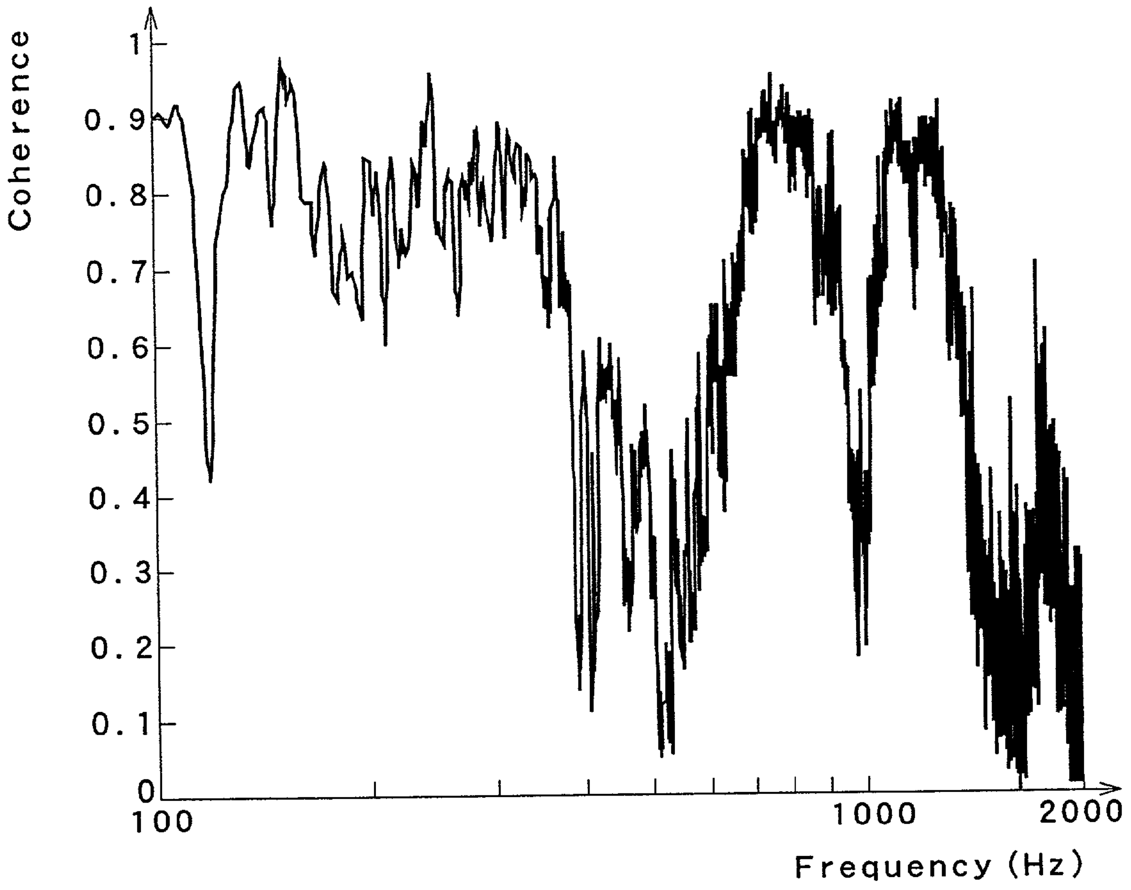
FIG. 10 is a frequency characteristics graph of the coherence between the noise signal and the error signal in a duct in the case where a rectifying measure (part 2) is carried out.

FIG. 8 shows, along the axis of frequency, the coherence between the noise signal of the noise detection microphone 35 and the error signal of the error detection microphone 36 in the case that a rectifying grid or a rectifying net, which is a rectifying part, is not used. FIG. 9 shows, along the axis of frequency, the coherence in the case that a rectifying grid 32 (honeycomb material of which the opening ratio is 96% and of which the grid length is 40 mm) and one unit of rectifying net (opening ratio of 60%) are used as a rectifying part. FIG. 10 shows the coherence in the case that a rectifying grid 32, which is a rectifying part, and a first rectifying net 33 as well as a second rectifying net 34 (both having an opening ratio of 72%). These rectifying nets 33 and 34 are selected so as to have a pressure loss that is equal to that of the one unit of the rectifying net used in the experiment of FIG. 9. All of the above figures are results in the case of airflow of an average velocity of 6 m/s within a duct, which is a rectangular duct with internal dimensions of 100 mm×100 mm.

In the case that a rectifying part is not used, as shown in FIG. 8, the coherence is lowered in the frequency band of 300 Hz or less, while in the case that a rectifying grid and one unit of rectifying net are used, as shown in FIG. 9, the coherence is improved in the range of from 100 Hz to 300 Hz. This is because the disturbance factors, the swirl factors and the rotating flow factors are lowered in the fluid A by carrying out the rectification within the duct by means of the rectifying grid and the rectifying net. That is to say, the correlations between the amplitude of each of the frequency factors of the sound wave in the vicinity of the noise detection microphone 35 and that of the error detection microphone 36 as well as between the phase of each of the frequency factors of the sound wave in the vicinity of microphone 35 and that of microphone 36 are shown to have become stronger.

Figure 4:
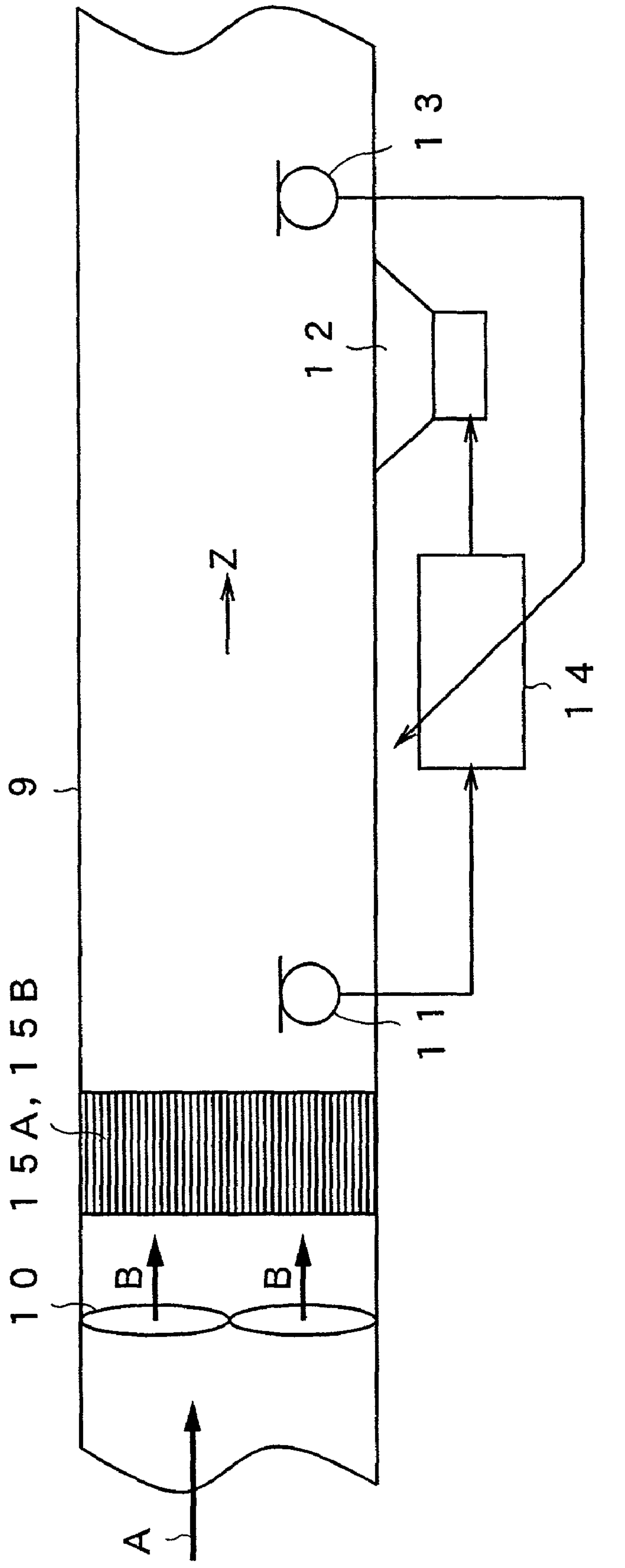
FIG. 4 (PRIOR ART)
FIG. 4 is a configuration diagram of an active noise control system according to a prior art.
Figure 5:
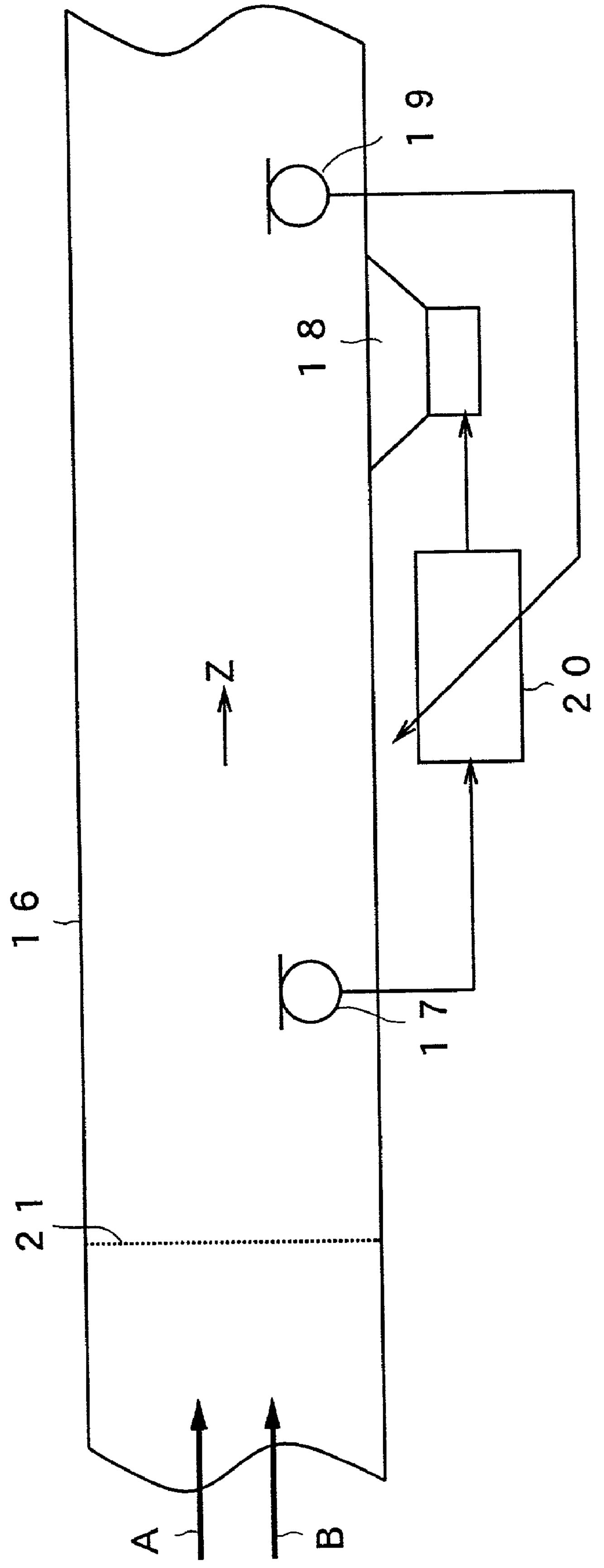
FIG. 5 (PRIOR ART)
FIG. 5 is a configuration diagram of an active noise reduction system according to a prior art.
Figure 6:
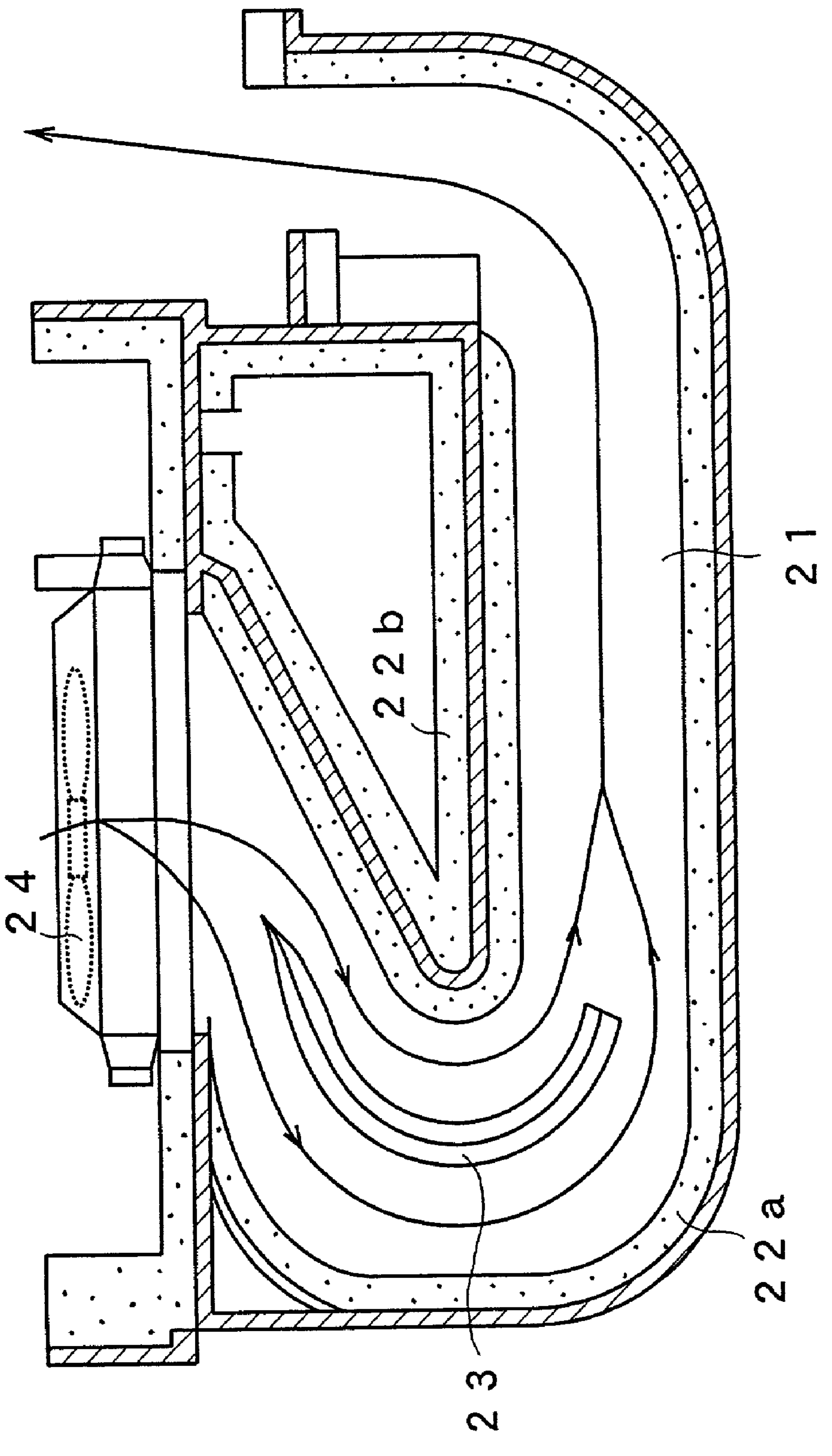
FIG. 6 (PRIOR ART)
FIG. 6 is a configuration diagram of a noise reduction system according to a prior art that is used in an enveloping type engine.

In addition, as shown in FIG. 10, when the rectifying grid 32 and the first rectifying net 33 as well as the second rectifying net 34, which make up a rectifying part 31, are used, the coherence in the range of from 100 Hz to 300 Hz is further improved in a duct having a complicated form in comparison with the active noise control system of FIG. 4, which only one of the rectifying members is used.

Figure 11:
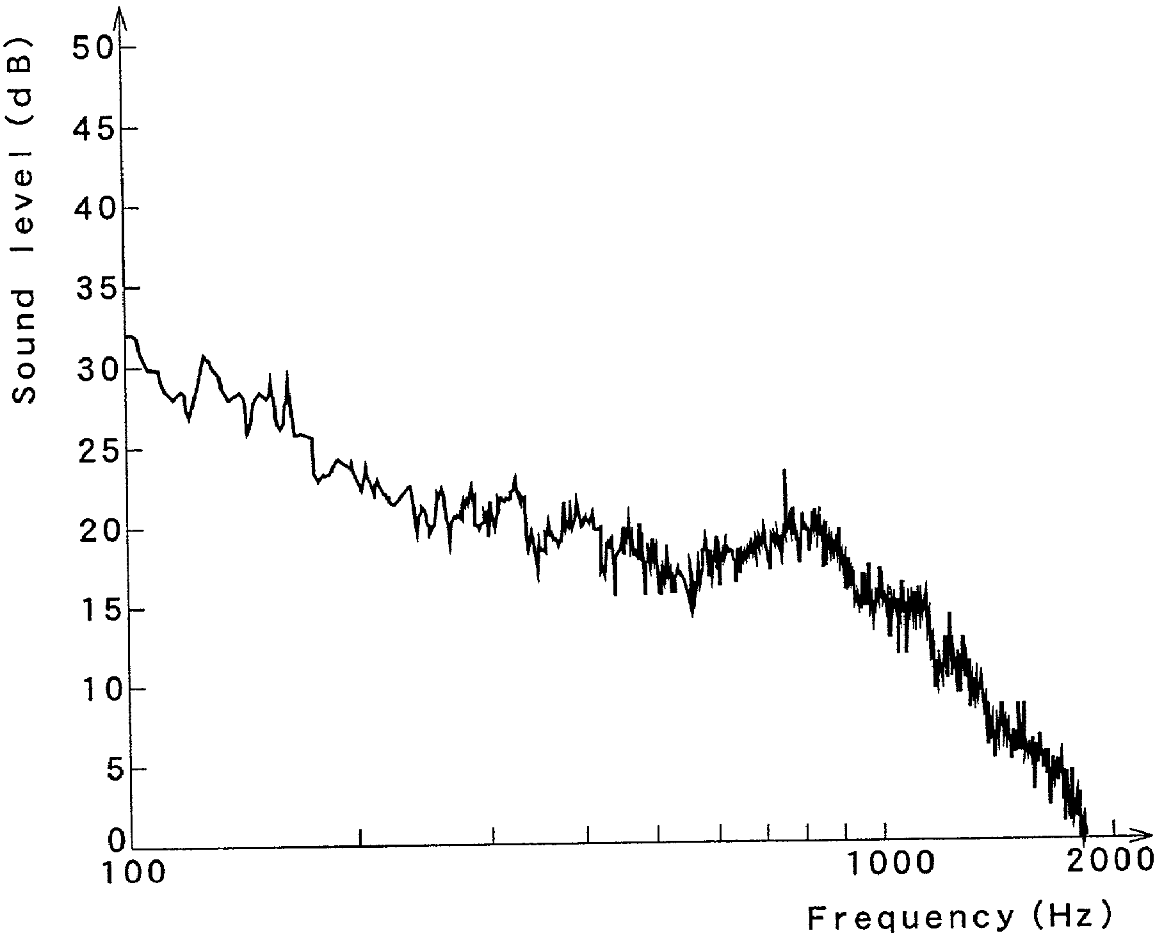
FIG. 11 is a characteristics graph of the sound pressure frequency of an error signal in the condition as in FIG. 8.
Figure 12:
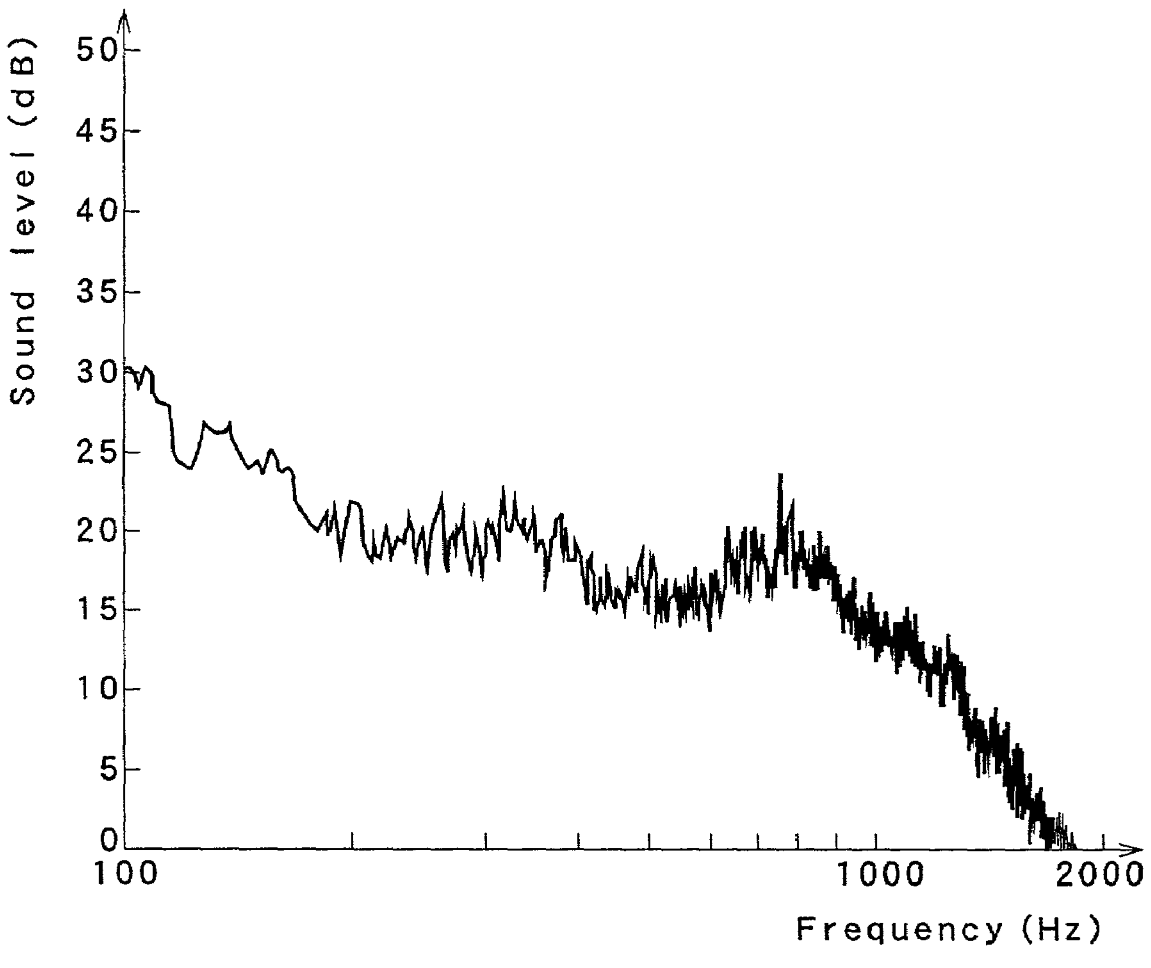
FIG. 12 is a characteristics graph of the sound pressure frequency of an error signal in the condition as in FIG. 9.
Figure 13:
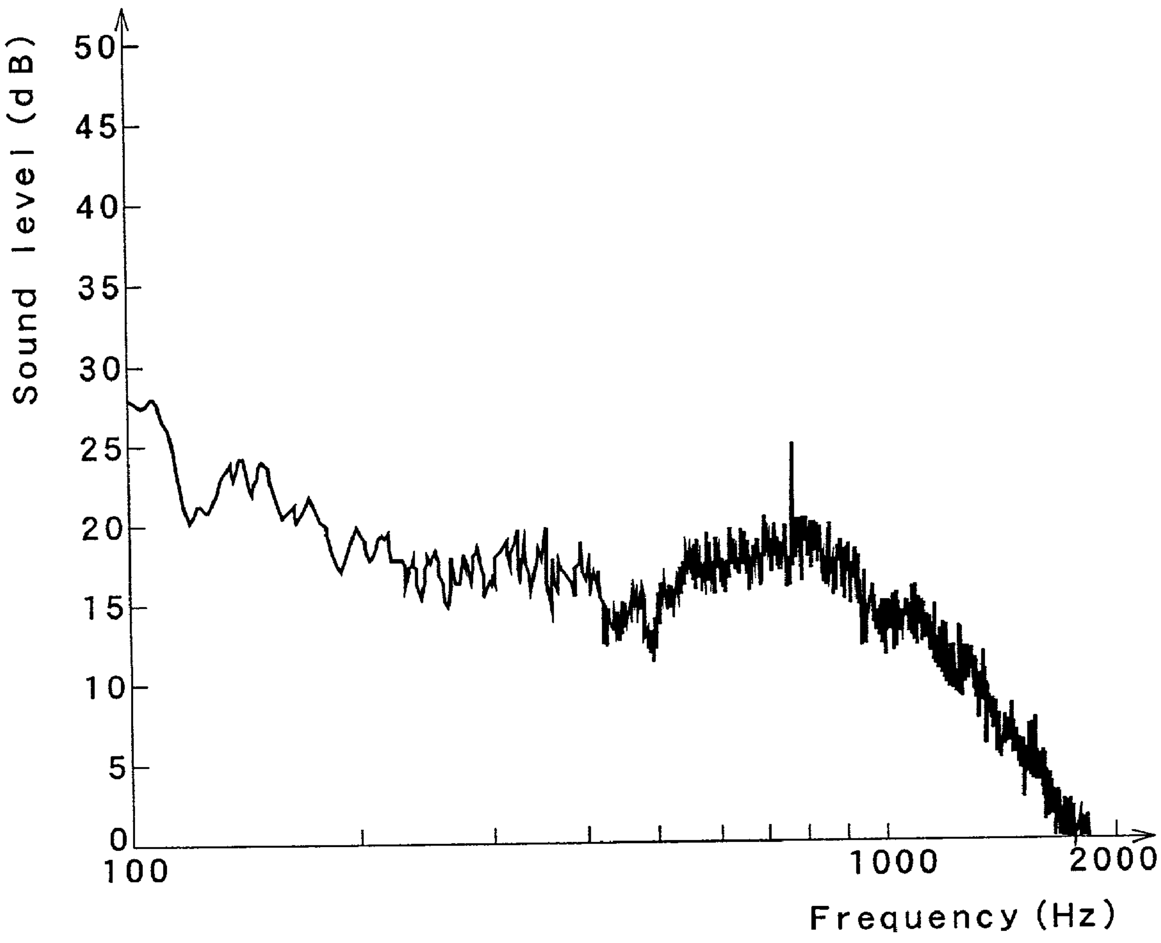
FIG. 13 is a characteristics graph of the sound pressure frequency of an error signal in the condition as in FIG. 10.

FIG. 11 shows the sound pressure and frequency characteristics in the case that the rectifying part 31 is not used. FIG. 12 shows the sound pressure and frequency characteristics in the case that a rectifying grid and one unit of rectifying net are used as a rectifying part. FIG. 13 shows the sound pressure characteristics in the case where a rectifying grid 32 and a first rectifying net 33 as well as a second rectifying net 34 are used as a rectifying part 31.

In the case that no rectifying part is used, as shown in FIG. 11, and in the case that rectification is carried out within the duct by means of a rectifying grid and one unit of rectifying net, it is can be seen that sound pressure of noise of 300 Hz or less is lowered. Furthermore, in the case of FIG. 13 wherein the rectifying grid 32 and the first rectifying net 33 as well as the second rectifying net 34, which make up the rectifying part 31, are used, it can be seen that sound pressure of 300 Hz or less is further lowered to be made lower than the results shown in FIGS. 11 and 12. This reduction amount is considered to mean that the pressure fluctuation factors caused by disturbance, swirl, rotating flow and the like are suppressed and the coherence is further improved. Thus, it can be seen that the rectification is further promoted in the duct that has a complicated form by providing the rectifying grid 32 and the first rectifying net 33 as well as the second rectifying net 34 to a portion downstream in the duct.

Here, though in the present embodiment a member of which the cross section has a honeycomb form is used as the rectifying grid 32, a member of which the cross section has a circular shape, a rectangular shape, or other shapes, may be used as described above. In addition, as for the first rectifying net 33 and the second rectifying net 34, other types of nets are used in the present embodiment may be used, which may be selected based on a well known evaluation standard for rectifying a fluid. In addition, though nets of the same opening ratio are utilized as the first and second rectifying nets 33 and 34 in the present embodiment, nets of differing opening ratios may be utilized.

Figure 7:
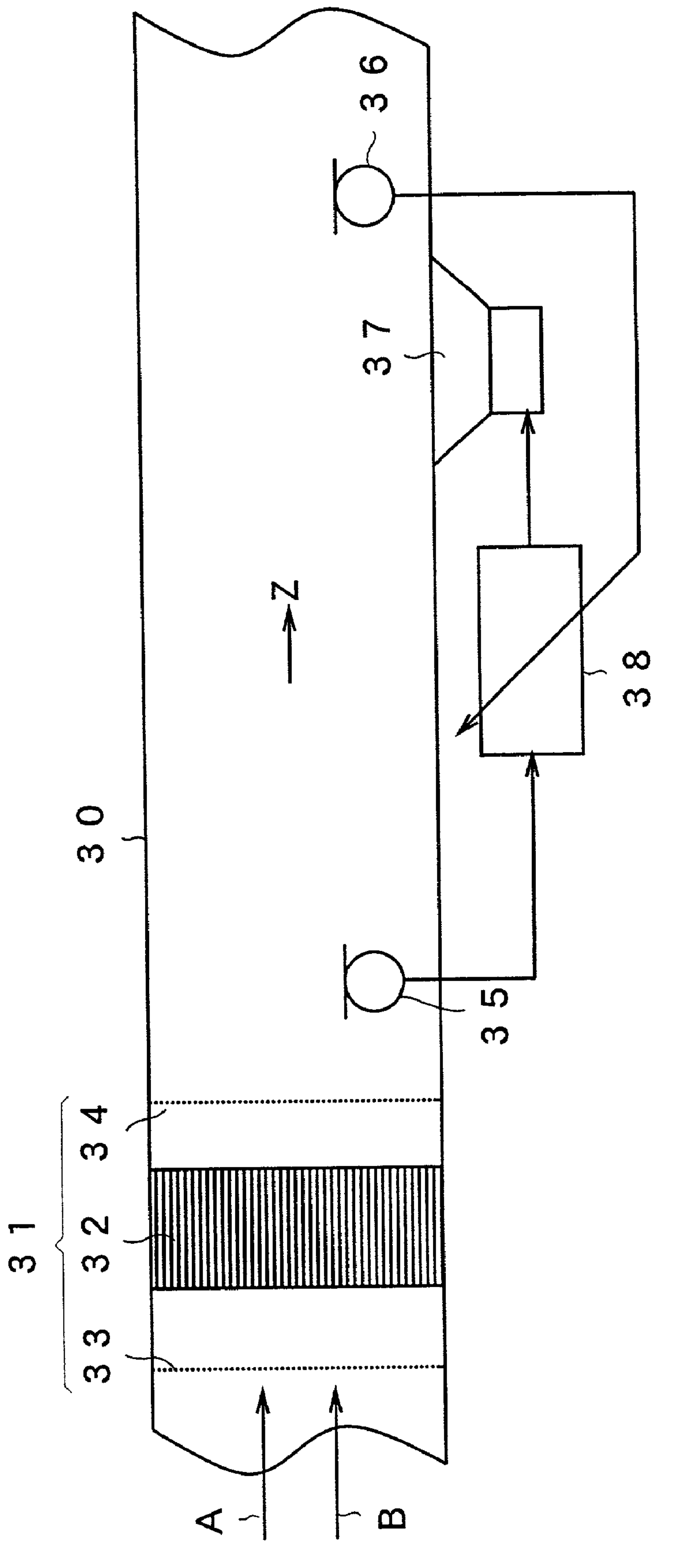
FIG. 7 is a configuration diagram of an active noise control system according to first embodiment of the present invention.

Furthermore, though a case where the direction in which the fluid progresses and the direction in which the noise B is propagated are the same as indicated by the arrow in FIG. 7 is shown in the present embodiment, there may be a case where the direction in which the fluid A progresses and the direction in which the noise B is propagated are opposite to each other. For example, as shown in FIG. 14, when the direction of the axis of the duct 30 is the Z axis, the fluid A flows in the direction of +Z and in the case that an absorbing fan is provided on the exhaust side, the noise B is propagated in the direction of −Z, as shown in the figure.

Figure 14:
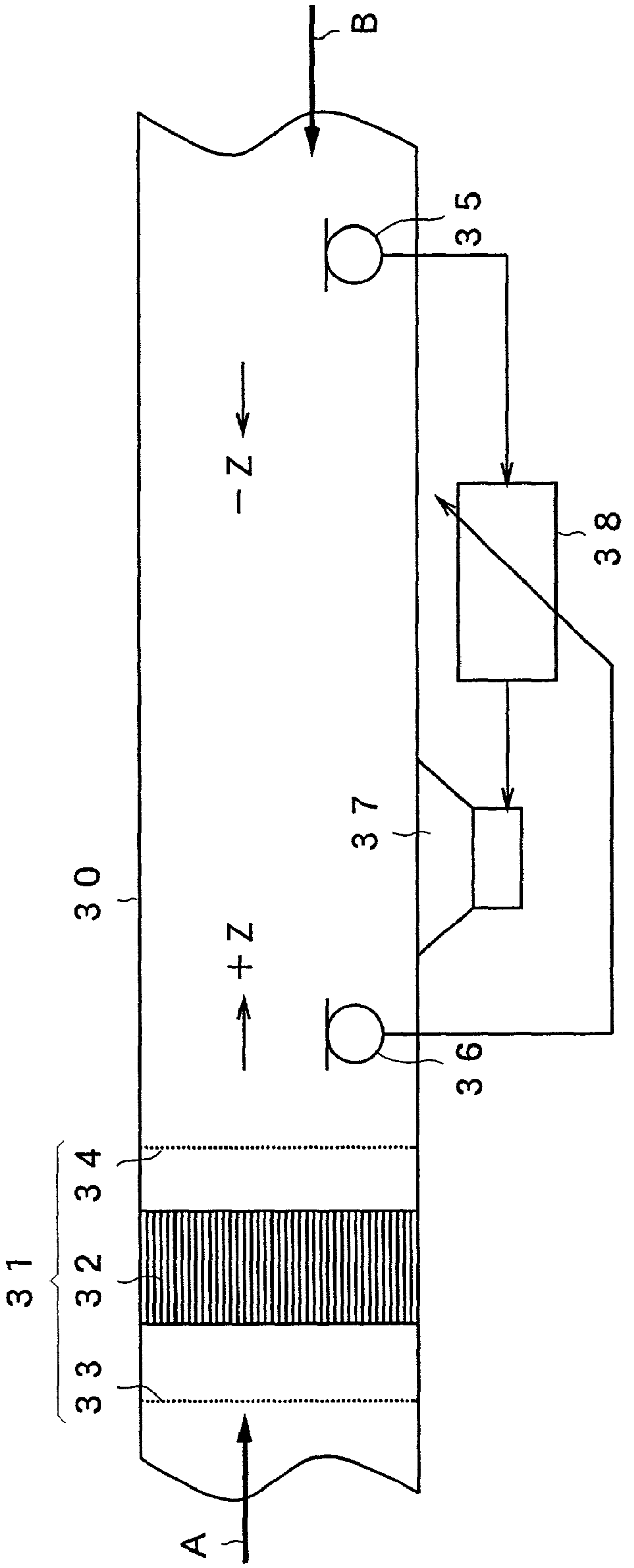
FIG. 14 is a configuration diagram of the active noise control system of first embodiment on the premise of the case where the progressing direction of the fluid and the propagating direction of the noise are different.

In the case that the user of an apparatus that has such a cooling unit is positioned on the left side in FIG. 14, it is necessary for the noise to be reduced on the user side. In such a case, when the rectifying grid 32, the first rectifying net 33 and the second rectifying net 34, which make up the rectifying part 31, are provided on the left side of the duct 30, the error detection microphone 36, the control sound source 37 and the noise detection microphone 35 are attached so as to be arranged in this order starting from the vicinity of the second rectifying net 34 to the direction of +Z. Then the arithmetic circuit 38 is provided so as to generate a control signal based on a reference signal from the noise detection microphone 35 and a residual signal from the error detection microphone 36.

As described above as shown in the present embodiment, even in the case that a duct has a complicated structure, a fluid within the duct can be rectified by using both the rectifying grid and the two rectifying nets as a rectifying part of the duct. As a result, the correlation between the noise signal of the noise detection microphone and the error signal of the error detection microphone is enhanced so that an active noise control system that has an excellent noise reduction effect can be implemented.

(Second Embodiment)

Figure 15:
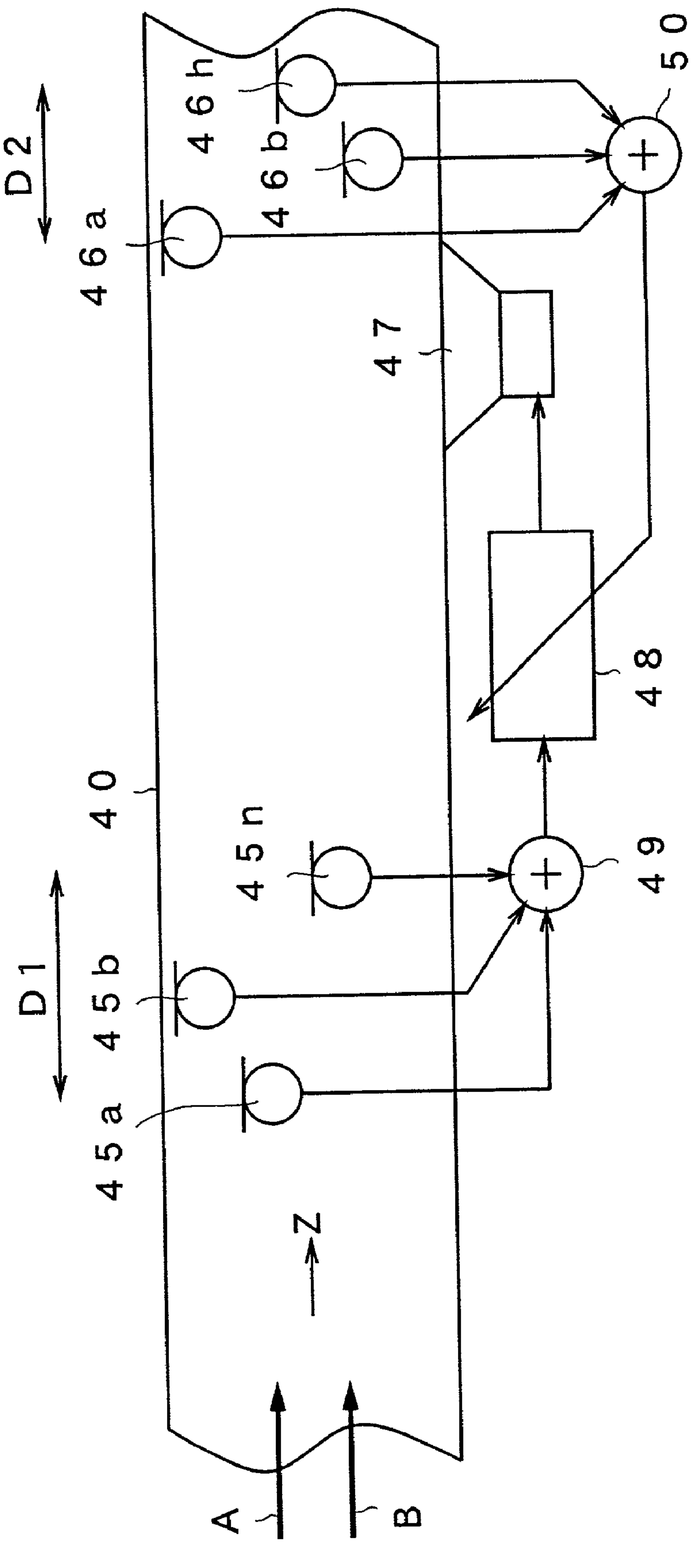
FIG. 15 is a configuration diagram of an active noise control system according to second embodiment (part 1) of the present invention.
Figure 16:
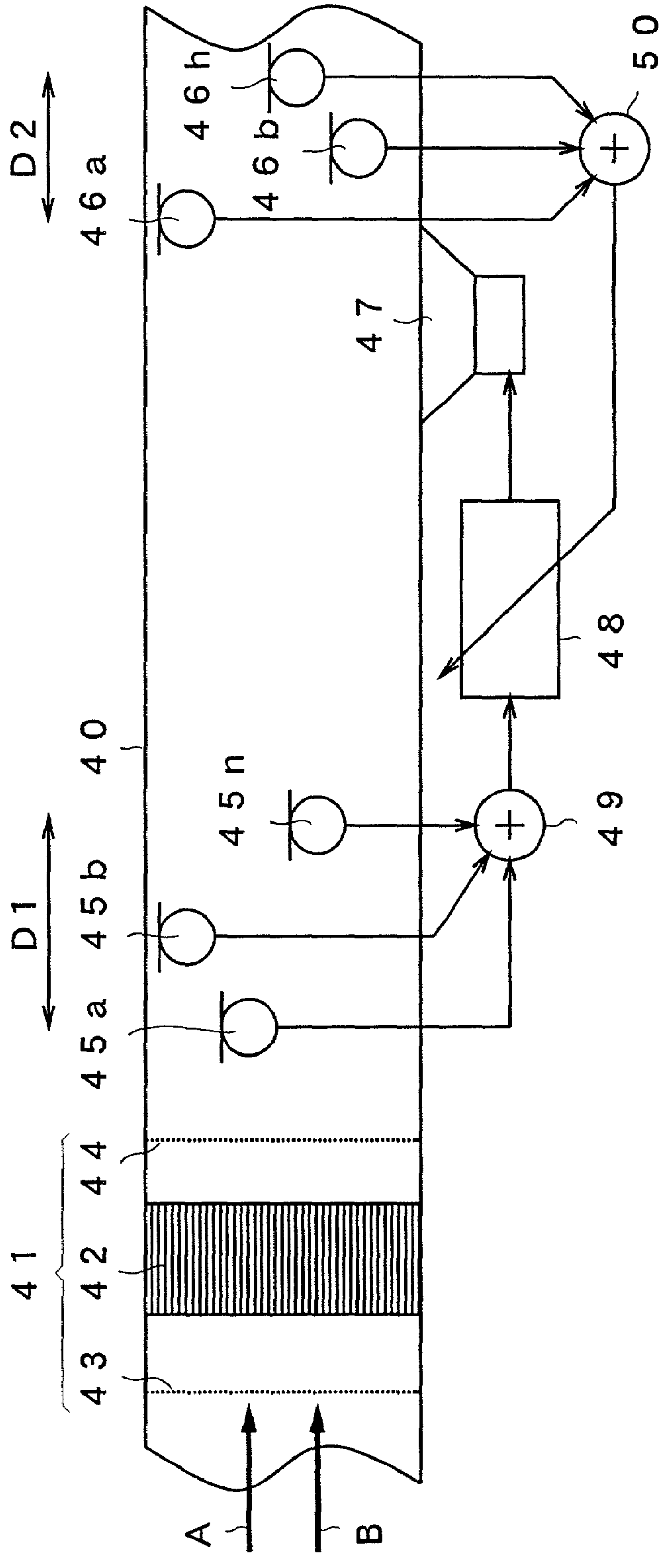
FIG. 16 is a configuration diagram of an active noise control system according to second embodiment (part 2) of the present invention.

Next, an active noise control system according to the second embodiment of the present invention is described in detail in reference to FIGS. 15 to 21. A configuration diagram of the entirety of the active noise control system according to the present second embodiment is shown in FIGS. 15 and 16. The coherence between the noise signal of the noise detection microphone and the error signal of the error detection microphone gained by the active noise control system of the present embodiment is shown in FIGS. 17 to 21.

As shown by the arrow in FIG. 15, a fluid A flows in the direction of Z and a noise B is also propagated in the direction of Z. A plurality of noise detection microphones 45*a*, 45*b* . . . 45*n* is attached to a duct 40 and a control sound source 47 and error detection microphones 46*a*, 46*b* . . . 46*h* are attached to this duct 40 downstream from the plurality of noise detection microphones. The number of noise detection microphones and the number of error detection microphones may be the same or may differ. The greatest distance among the distances between noise detection microphones 45*a* to 45*n* along the direction in which the sound is propagated within the duct is denoted as D1. The greatest distance among the distances between error detection microphones 46*a* to 46*h* along the direction in which the sound is propagated within the duct is denoted as D2.

Then, a first adder 49 is provided for adding reference signals of the noise detection microphones 45*a*, 45*b*, . . . 45*n*. In addition, a second adder 50 is provided for adding residual signals of the error detection microphones 46*a*, 46*b* . . . 46*h*. An arithmetic circuit 48 is provided for generating a control signal based on the output of the first adder 49 and on the output of the second adder 50. That is to say, the arithmetic circuit 48 generates a control signal so that the output of the second adder 50 becomes small by using an active noise control algorithm. A control sound source 47 is a speaker that converts the control signal of the arithmetic circuit 48 into a control sound and that radiates the control sound in the downstream area of the duct 40.

The operation of the active noise control system formed in such a manner is described below. The noise detection microphones 45*a* to 45*n* respectively detect noise from a plurality of points in the upstream area within the duct 40 and give respective noise signals to the first adder 49. The first adder 49 adds up n output signals of the noise detection microphones and the result is outputted to the arithmetic circuit 48. In addition, the error detection microphones 46*a*, 46*b* . . . 46*h* respectively detect residual signals at a plurality of points in the downstream area within the duct 40 so that respective residual signals are given to the second adder 50. The second adder 50 adds up h residual signals of error detection microphones and the result is outputted to the arithmetic circuit 48.

The arithmetic circuit 48 generates a control signal that allows the error signal, which has an correlation with the noise signal, to become small at all times by means of an LMS (least mean square) algorithm or the like, and the control signal is outputted to a control sound source 47. A transfer function between the adder 49 and the adder 50, that is to say an equivalent transfer function from the noise detection microphones 45*a* to 55*n* to the error detection microphones 46*a* to 46*h* via the duct 40 is denoted as G. In addition, a transfer function from the control sound source 47 to the second adder 50, that is to say an equivalent transfer function from the control sound source 47 to the error detection microphones 46*a*, 46*b* . . . 46*h* is denoted as C. When the output value of the second adder 50 approaches zero through the operation of the arithmetic circuit 48, the transfer function of the arithmetic circuit 48 becomes −G/C. Accordingly, when the noise signal outputted from the first adder 49 is denoted as N, the value within the duct 40 due to the control sound of the control sound source 47 becomes as follows:

$$N\cdot(-G/C)\cdot C=-N\cdot G.$$

The noise and the control sound interfere with each other in the region where the error detection microphones 46*a* to 46*h* are arranged so as to become as follows:

$$N\cdot G+(-N\cdot G)=0.$$

Accordingly, the noise level is reduced through the interference of the control sound in the region where the error detection microphones 46*a* to 46*h* are installed.

On the other hand, an error signal becomes as follows in the case wherein an error signal BN that has no correlation with the noise signal exists:

$$N\cdot G+BN.$$

The arithmetic circuit 48 cannot generate a control signal that allows the error signal, which does not have an correlation with the noise signal, to become small. Therefore, the result of the synthesis of the noise and the control sound at the points of the error detection microphones 46*a* to 46*h* becomes as follows:

$$N\cdot G+BN+(-N\cdot G)=BN.$$

Accordingly, the residual noise becomes BN. As for the noise within the duct 40, the causes that lower the coherence between the noise signals of the noise detection microphones 45*a* to 45*n* and the error signals of the error detection microphones 46*a* to 46*h* are pressure fluctuations occurring due to disturbance factors, swirl factors, rotating flow factors and the like as described above. That is to say, the coherence lowers due to the existence of BN in the above equation. Since the pressure fluctuations due to disturbance, swirl, rotating flow and the like are local, pressure fluctuations do not have correlations with a plurality of proximate points.

On the other hand, the noise in the frequency bands that have long wavelengths, in comparison with the dimensions of the duct cross section from among respective frequency components of the noise within the duct 40, is propagated in the direction of Z as a plane wave within the duct 40. The sound pressure and the phase of the noise become equal in a plane perpendicular to the direction of the propagation of the noise in the frequency bands where the noise has become a plane wave. Accordingly, in the case that the noise detection microphones 45*a* to 45*n* and the error detection microphones 46*a* to 46*h* are, respectively, placed in a plane perpendicular to the direction of propagation of noise, a noise signal detected by, for example, the noise detection microphone 45*a* becomes as follows. That is to say, when the noise signal within the duct 40 is denoted as N1 and the pressure fluctuation that has occurred due to disturbance factors, swirl factors, rotating flow factors, and the like, of the fluid is denoted as BN1, the synthesized noise signal becomes as follows:

$$N1+BN1.$$

The noise signal detected by the noise detection microphone 45*n* becomes as follows in the same manner as in the above. That is to say, when the noise signal within the duct is denoted as Nn and the pressure fluctuation that has occurred due to disturbance factors, swirl factors, rotating flow factors and the like of the fluid is denoted as BNn, the synthesized noise signal becomes as follows:

$$Nn+BNn.$$

The first adder 49 adds up the noise signals from the noise detection microphones 45*a* to 45*n*, respectively, and the result is outputted. The output of the first adder 49 in this case becomes as follows:

$$(N1+BN1)+(N2+BN2)+ \ldots +(Nn+BNn).$$

Here, the sound pressure and the phase of the noise within a plane perpendicular to the direction of propagation of the noise become equal in the frequency bands where the noise becomes a plane wave as described above. Therefore, in the case of D1=D2=0, the noise signals within the duct 40 of a plane wave become N1=N2= . . . =Nn=N. Therefore, the output of the first adder 49 becomes as follows:

$$n \times N+BN1+BN2+ \ldots +BNn.$$

BN1+BN2+ . . . +BNn in the above equation becomes smaller than the value of n×BN, because there is no correlation herein. Therefore, the ratio of the pressure fluctuation that has occurred due to disturbance factors, swirl factors, rotating flow factors and the like of the fluid to the output of the first adder 49 is lowered by adding up the output signals of the plurality of noise detection microphones and, whereby the noise signals are clarified within the duct 40.

By adding up the output signals of the plurality of error detection microphones 46*a* to 46*n* in the same manner as for the error detection microphones, the ratio of the pressure fluctuation that has occurred due to disturbance factors, swirl factors, rotating flow factors and the like of the fluid to the output of the first adder 50 is lowered and, so that the noise signals within the duct 40 become clarified. Therefore, in comparison with the coherence between an output signal of each of the noise detection microphones 45*a* to 45*n* and an output signal of each of the error detection microphones 46*a* to 46*h*, the coherence between the output signal of the first adder 49 and the output signal of the second adder 50 represents a high value.

Figure 17:
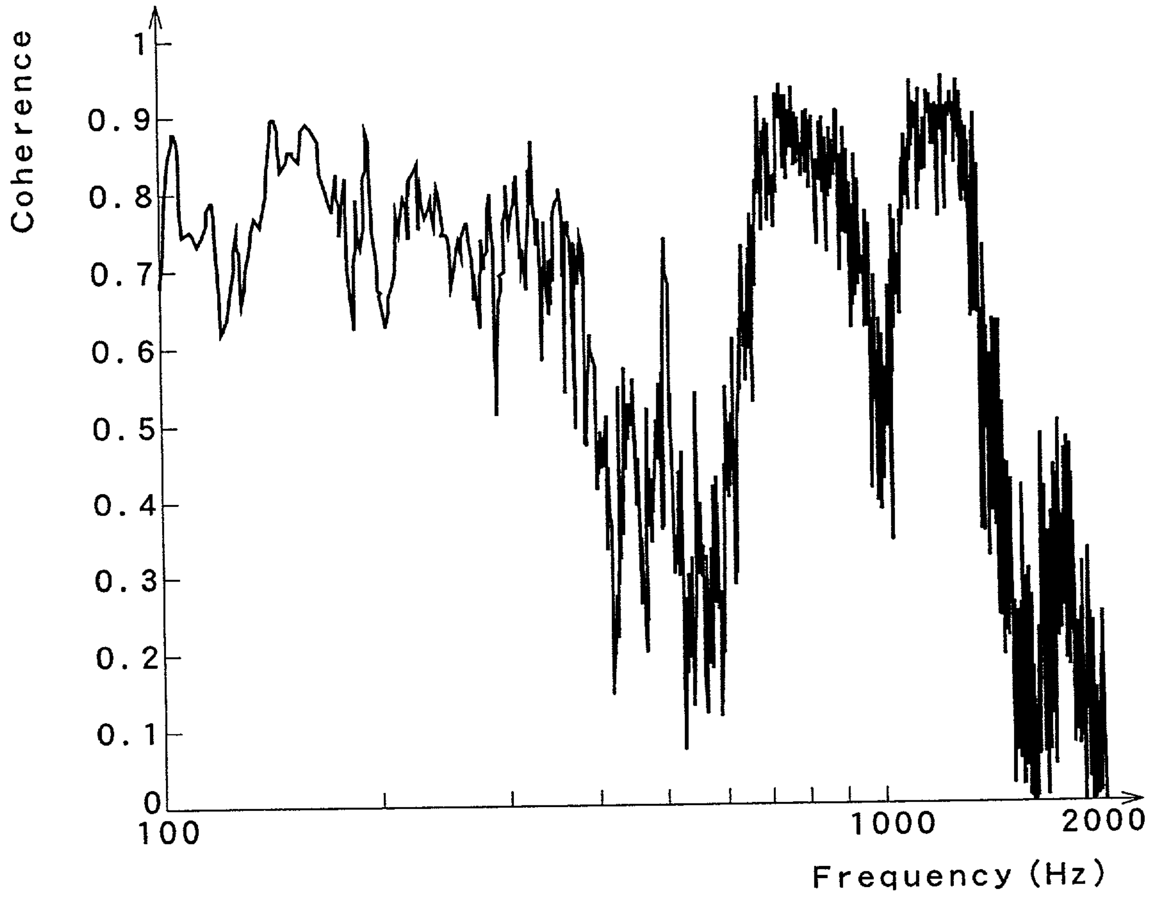
FIG. 17 is a characteristics graph of a coherence frequency (part 1) between the output signals of the first adder and the second adder in the active noise control system shown in FIG. 15.

FIG. 17 shows the coherence between the output signal of the first adder 49 and the output signal of the second adder 50 in the case that a signal of one noise detection microphone is inputted to the first adder 49 while signals of four error detection microphones that are provided so that D2=0 cm are inputted to the second adder 50.

Figure 18:
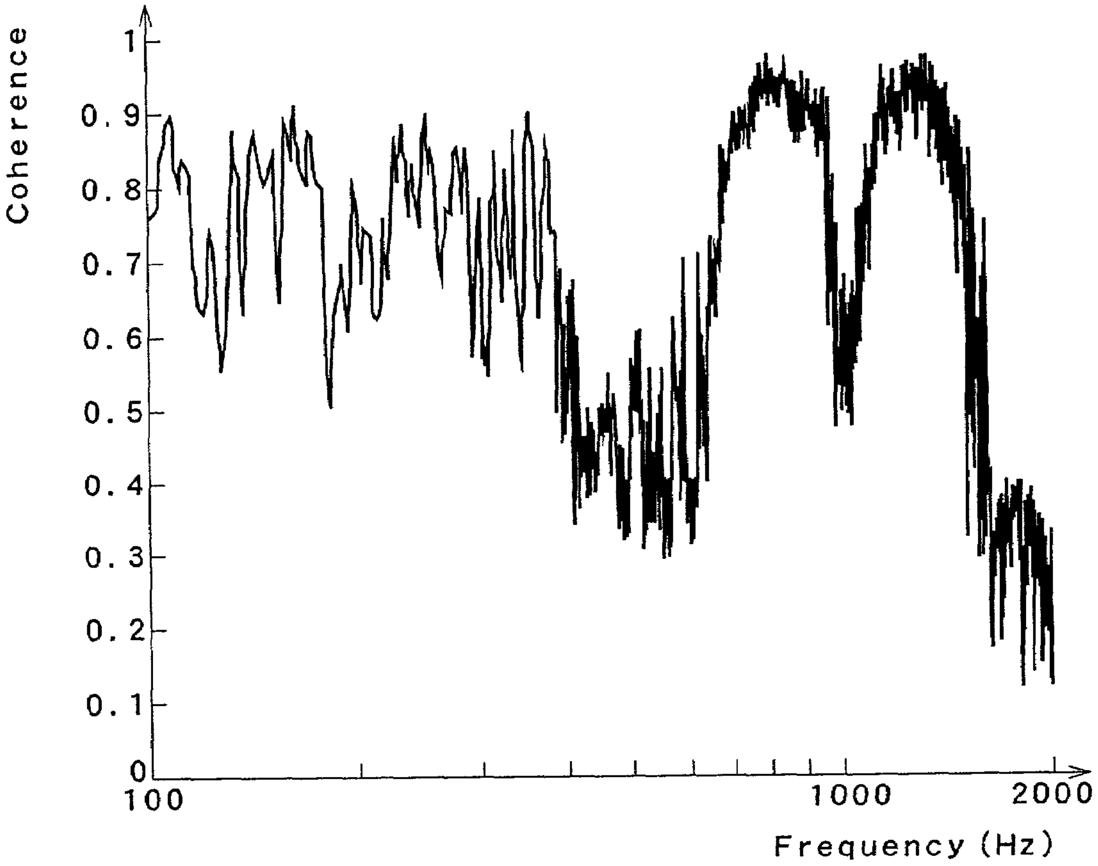
FIG. 18 is a characteristics graph of a coherence frequency (part 2) between the output signals of the first adder and the second adder in the active noise control system shown in FIG. 15.

FIG. 18 shows the coherence between the output signal of the first adder 49 and the output signal of the second adder 50 in the case that signals of four noise detection microphones that are provided so that D1=0 cm are inputted to the first adder 49 while a signal of one error detection microphone is inputted to the second adder 50.

Figure 19:
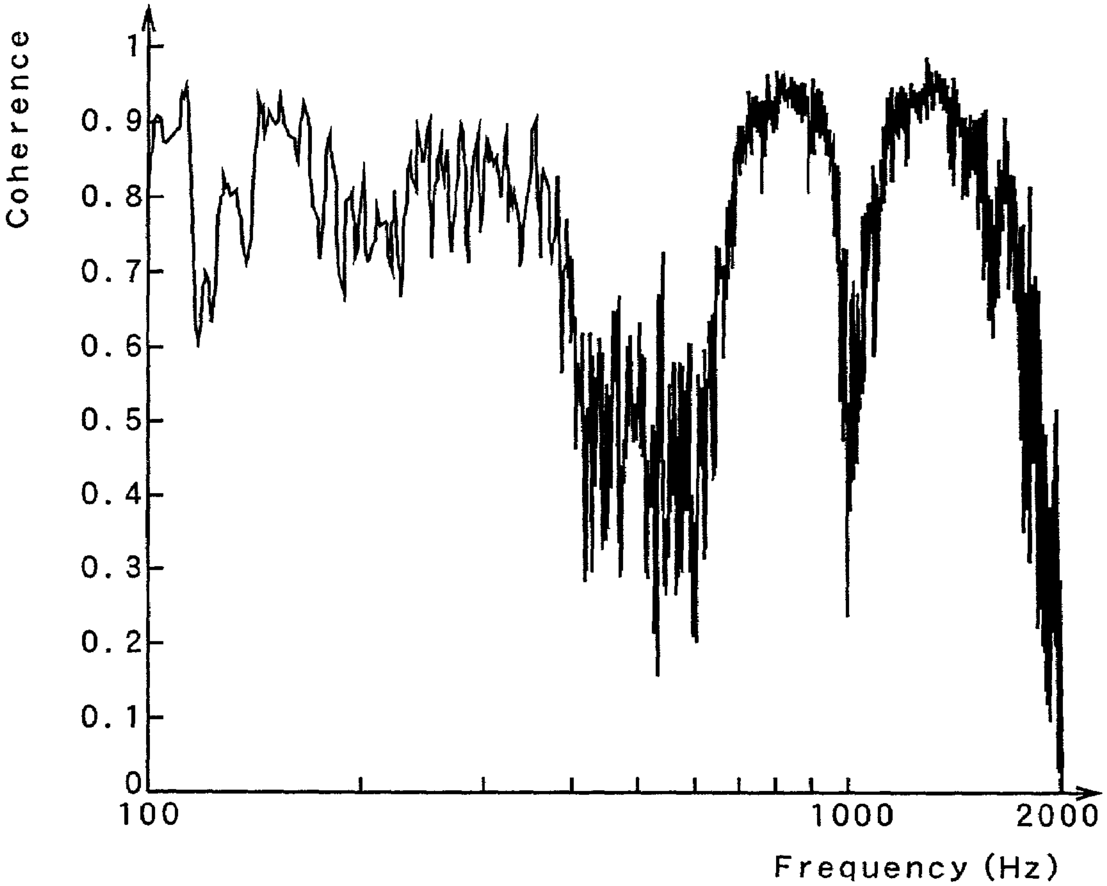
FIG. 19 is a characteristics graph of a coherence frequency (part 3) between the output signals of the first adder and the second adder in the active noise control system shown in FIG. 15.

FIG. 19 shows the coherence between the output signal of the first adder 49 and the output signal of the second adder 50 in the case that signals of four noise detection microphones that are provided so that D1=0 cm are inputted to the first adder 49 while signals of four error detection microphones that are provided so that D2=0 cm are inputted to the second adder 50.

Figure 20:
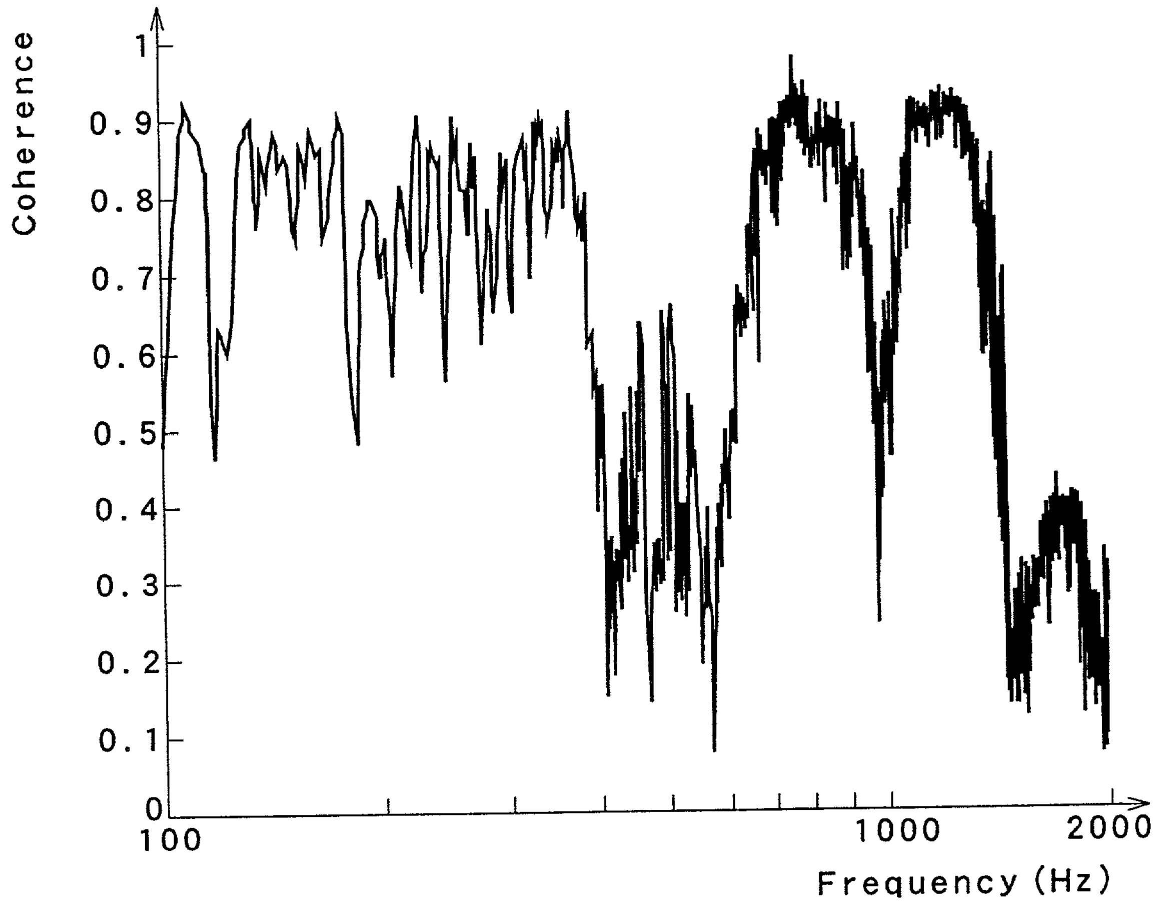
FIG. 20 is a characteristics graph of a coherence frequency (part 4) between the output signals of the first adder and the second adder in the active noise control system shown in FIG. 15.

In addition, FIG. 20 shows the coherence between the output signal of the first adder 49 and the output signal of the second adder 50 in the case that signals of four noise detection microphones that are provided so that D1=10 cm are inputted to the first adder 49 while a signal of one error detection microphone is inputted to the second adder 10.

All of the above are the results in the case that air with an average speed of 6 m/s is allowed to flow within a rectangular duct with internal dimensions of 100 mm×100 mm. In respective cases the coherence is improved in the range of from 100 Hz to 300 Hz in comparison with the case wherein one noise detection microphone and one error detection microphone are, respectively, provided as shown in FIG. 8. Here, in the case that one error detection microphone and a plurality of noise detection microphones or a plurality of error detection microphones and one noise detection microphone are provided, this also improves the coherence between the first and second adders. On the other hand, the case where four noise detection microphones are provided such that D1=0 cm as shown in FIG. 18 and the case where four noise detection microphones are provided such that D1=10 cm as shown in FIG. 20 are compared in coherence below. In these comparison results, the coherence shown in FIG. 20 indicates a value lower than that of the coherence shown in FIG. 18 in the frequency bands of 800 Hz or more. This is because D1=10 cm corresponds to ¼ of the wavelength (phase angle of 90 degrees) of 850 Hz. Then, the distance of D1=10 cm becomes of 90 degrees, or more, in the phase angle in the frequency bands of 850 Hz or more and, therefore, the phenomenon occurs where the output signals cancel each other in the case that output signals of a plurality of noise detection microphones are added up.

Next, a duct 40 that has a rectifying part 41 as shown in FIG. 16 is considered. A rectifying grid 42 formed of a honeycomb material having a cell size of 3⁄16 inches, an opening ratio of 96% and a grid length of 40 mm is placed in the upstream area of this duct 40. Then, a first rectifying net 43 and a second rectifying net 44, of which the opening ratios are both 72%, are placed before and after the rectifying grid 42.

Figure 21:
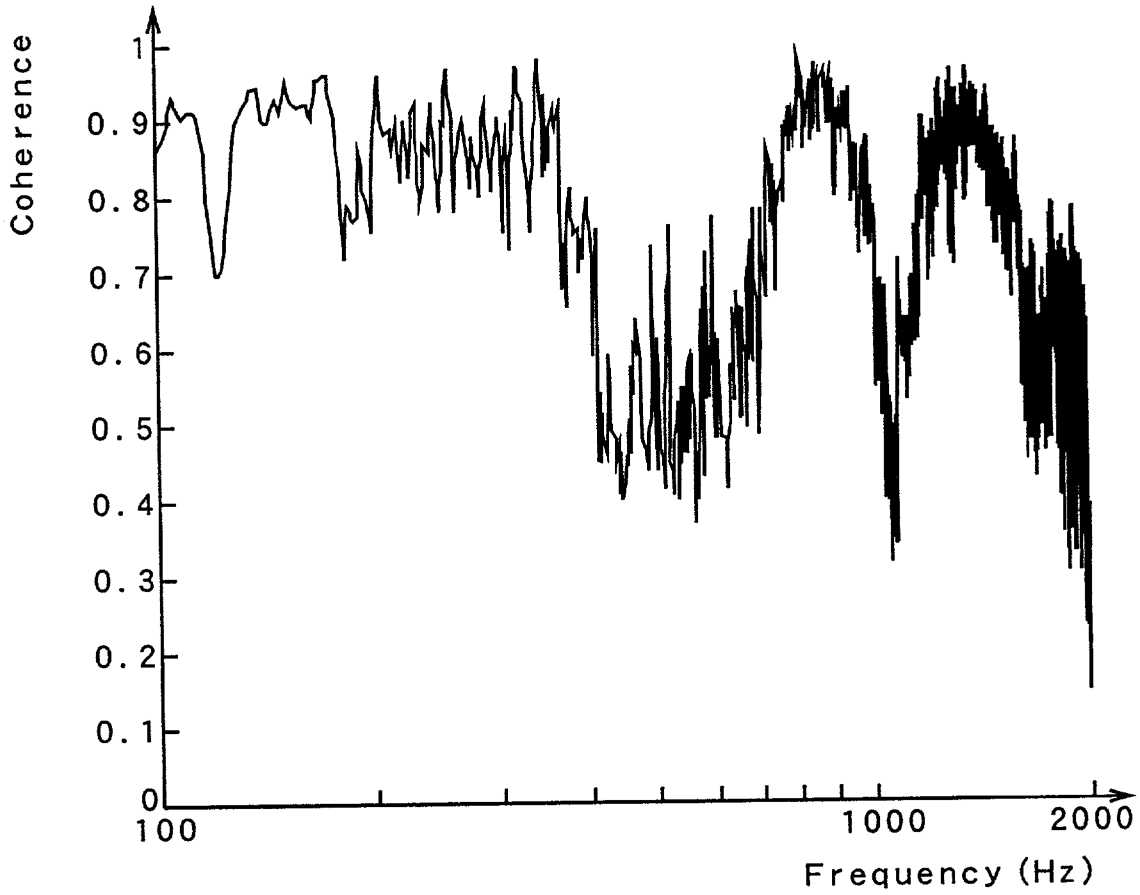
FIG. 21 is a characteristics graph of a coherence frequency (part 5) between the output signals of the first adder and the second adder in the active noise control system shown in FIG. 15.

FIG. 21 shows the coherence between the output signal of the first adder 49 and output signal of the second adder 50 in the case that signals of four noise detection microphones provided so that D1=0 are inputted to the first adder 49 while signals of four error detection microphones provided so that D2=0 are inputted to the second adder 50 in the active noise control system of FIG. 16.

All of the above are the results of the case where air with an average velocity of 6 m/s is allowed to flow within a rectangular duct having internal dimensions of 100 mm×100 mm. The coherence between the output signals of one noise detection microphone and one error detection microphone shown in FIG. 9 is denoted as γ1 (f). The coherence in the case that the rectifying grid and the two rectifying nets shown in FIG. 10 are utilized is denoted as γ2 (f). When a signal of a noise detection microphone is inputted to the first adder 49 while signals of four error detection microphones provided so that D2=0 cm are inputted to the second adder 50, the coherence between the output signals of the first adder 49 and the second adder 50 is denoted as γ3 (f). It is found that the coherence in the range of from 100 Hz to 300 Hz has improved according to the characteristics shown in FIG. 21 in comparison with the coherence γ1 (f), γ2 (f) and γ3 (f) Here, though in the present embodiment a member of which the cross section is in a honeycomb form is used as a rectifying grid 42, the cross sectional form is not limited to a honeycomb but, rather, a member of which the cross section is in a circular form, a rectangular form or other forms may be used. In addition, as for the first rectifying net 43 and the second rectifying net 44, nets for rectifying a fluid based on a well known evaluation standard may be used.

In addition, though in the present embodiment nets of the same opening ratio are used for the first rectifying net and the second rectifying net, nets of differing opening ratios may be utilized. In addition, the present embodiment focuses on the case wherein, as shown by the arrows of FIGS. 15 and 16, the direction in which the fluid A progress and the direction in which the noise B is propagated are the same. However, by having the structure of FIG. 22 or 23 in the present embodiment, the same effects can, of course, be obtained in the case that the direction of propagation of a fluid and the direction of propagation of noise differ. Here, the components in FIG. 22 or FIG. 23 are the same as of the above described embodiment to which the same symbols are attached and the description of the structure thereof is omitted.

As shown in the present embodiment, by providing a rectifying part, the influence of the pressure variation due to disturbance factors, swirl factors, rotating flow factors and the like within the duct can be reduced.

Figure 22:
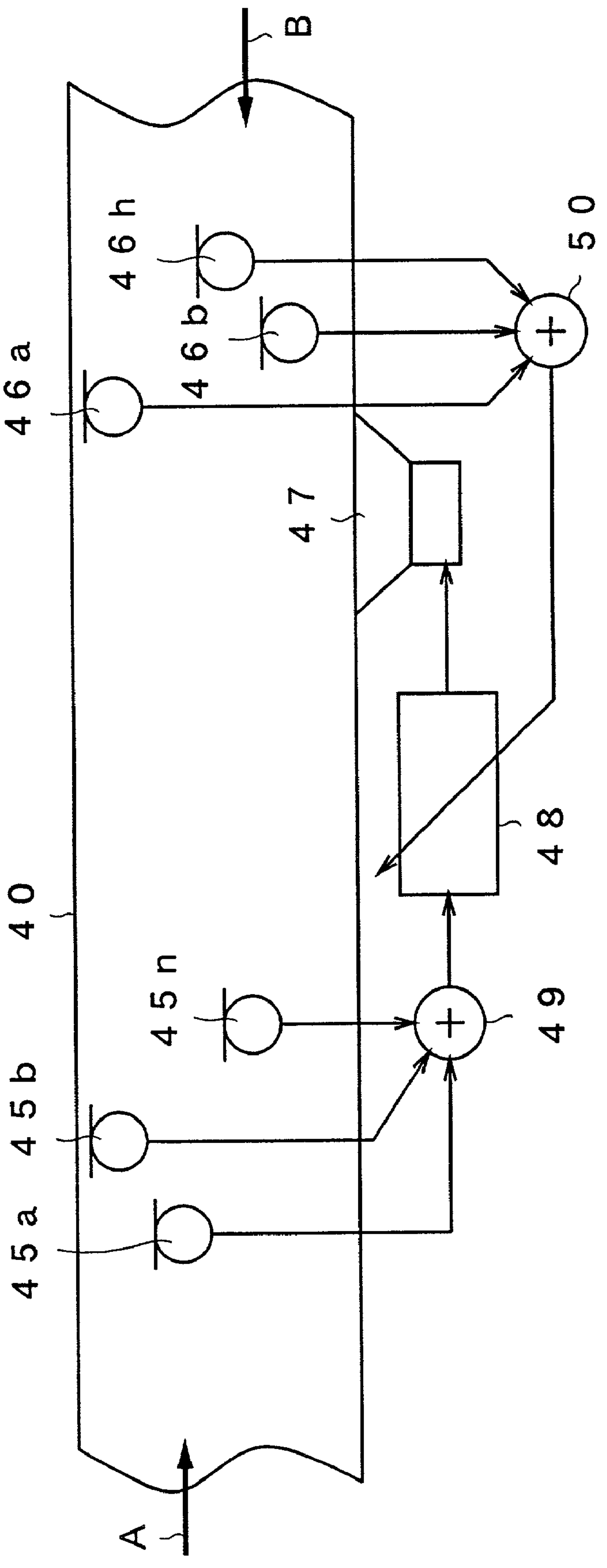
FIG. 22 is a configuration diagram of the active noise control system of second embodiment (part 1) on the premise of the case where the progressing direction of the fluid and the propagating direction of the noise are different.
Figure 23:
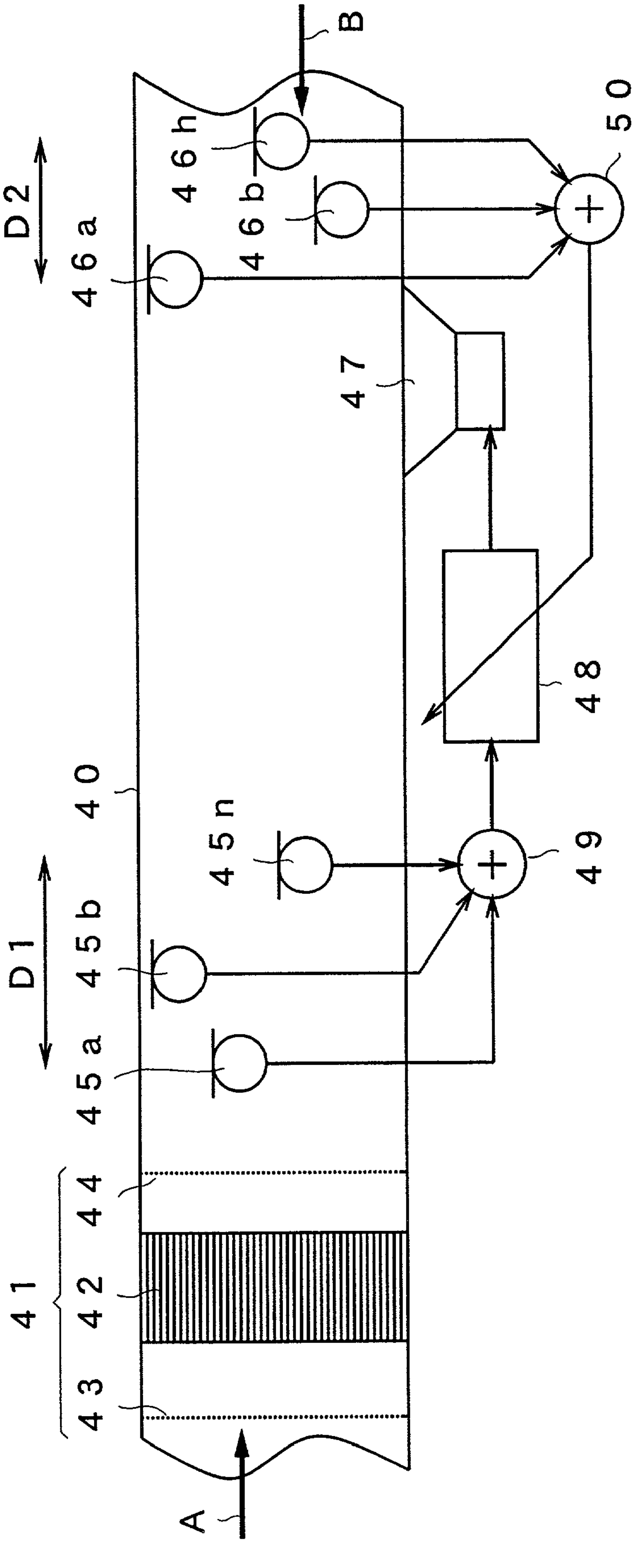
FIG. 23 is a configuration diagram of the active noise control system of second embodiment (part 2) on the premise of the case where the progressing direction of the fluid and the propagating direction of the noise are different.

In addition, as shown in FIG. 15 or FIG. 22, in the case that there is no rectifying part, disturbance factors, swirl factors and rotating flow factors are propagated downstream. For example, as shown in FIG. 15, in the case that the duct 40 is straight and short, the coherence between a plurality of installation locations of the noise detection microphones and a plurality of installation locations of the error detection microphones becomes, in many cases, high. This is because the disturbance factors, swirl factors and rotating flow factors in the upstream area are propagated downstream without a change of condition thereof. In this case, the coherence is maintained regardless of the fact that the fluid A is not rectified. Therefore, a reference signal of which the S/N is high in reference to the frequency components that are the objects of noise reduction can be gained by using a plurality of noise detection microphones. In addition, the total sum BN1+BN2+ . . . +BNn of pressure fluctuations due to disturbance factors and the like is set off and, in many cases, becomes zero in the downstream area of the duct 40 that is the position of the object of noise reduction. Therefore, in the case that a plurality of noise detection microphones and a plurality of error detection microphones are provided, a predetermined noise suppression effect is obtained without a rectifying part.

In addition, by providing error detection microphones or noise detection microphones, respectively, at intervals of ¼ of the wavelength or less of the frequency that is desired to be detected, the noise within the duct can be effectively detected. As a result, correlation between the noise signals of the noise detection microphones and the error signals of the error detection microphones is further enhanced so that an active noise control system that has an excellent noise reduction effect can be implemented.

In case one noise detection microphone is used in the abovementioned embodiment, the output of the noise detection microphone can be inputted directly to the arithmetic circuit without the first adder. Similarly, in case one error detection microphone is used in the abovementioned embodiment, the output of the error detection microphone can be inputted directly to the arithmetic circuit without the second adder.

As described above, according to the present invention, the correlationship between the noise signal detected by the noise detector and the noise signal detected shortly before the error detector is enhanced so that noise control sound that has an excellent noise reduction effect can be produced by using the coherence.

Furthermore, according to the present invention, in addition to above described effect, the influence of the pressure fluctuation of a fluid can be further reduced by using outputs of two adders and an excellent noise reduction effect can be obtained.

Moreover, according to the present invention, by placing rectifying nets upstream to, and downstream from, a rectifying grid, respectively, relative to the fluid flowing within the duct, it becomes possible to rectify the fluid within the duct with little pressure loss. As a result, the correlation is enhanced between the noise signal of the noise detector and the noise signal detected shortly before the error detector so that an excellent noise reduction effect can be obtained. It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

The text of Japanese priority application no. 2000-381490 filed on Dec. 15, 2000 is hereby incorporated by reference.

What is claimed is:

1. An active noise control system comprising:

a noise detector which detects a noise within a duct;

an error detector which is provided in a downstream side of the noise propagating within said duct for said noise detector to detect noise within said duct;

a control sound source which is installed in the vicinity of said error detector to radiate a control sound having approximately the same sound pressure as of and an opposite phase to the noise within said duct;

an arithmetic circuit which inputs an noise signal of said noise detector and an error signal of said error detector, sets a transfer function so that the error signal of said error detector becomes small, multiplies the noise signal of said noise detector with said transfer function, and outputs an multiplied result to said control sound source as a control signal; and a rectifying part which is provided in an upstream side of a fluid flowing within said duct for said noise detector and said error detector, and increases a coherence of the fluid between said noise detector and said error detector by rectifying the fluid within said duct, wherein said rectifying part includes:

at least one first rectifying net;

a rectifying grid having an opening ratio greater than that of said first rectifying net, and said rectifying grid placed in said duct downstream of and spaced from said first rectifying net; and at least one second rectifying net having an opening ratio smaller than that of said rectifying grid, and said second rectifying net placed in said duct downstream of and spaced from said rectifying grid.

2. The active noise control system according to claim 1, wherein the opening ratio of said first rectifying net and the opening ratio of said second rectifying net are equal.

3. The active noise control system according to claim 1, wherein said first rectifying net and said second rectifying net have different opening ratios.

4. The active noise control system according to claim 1, wherein said rectifying grid includes a plurality of capillaries.

5. An active noise control system comprising:

a noise detector which detects a noise within a duct;

an error detector which is provided in a downstream side of the noise propagating within said duct for said noise detector to detect noise within said duct;

a control sound source which is installed in the vicinity of said error detector to radiate a control sound having approximately the same sound pressure as of and an opposite phase to the noise within said duct;

an arithmetic circuit which inputs an noise signal of said noise detector and an error signal of said error detector, sets a transfer function so that the error signal of said error detector becomes small, multiplies the noise signal of said noise detector with said transfer function, and outputs an multiplied result to said control sound source as a control signal; and a rectifying part which is provided in an upstream side of a fluid flowing within said duct for said noise detector and said error detector, and increases a coherence of the fluid between said noise detector and said error detector by rectifying the fluid within said duct, wherein said rectifying part includes:

at least one first rectifying net;

a rectifying grid having an opening ratio greater than that of said first rectifying net, and said rectifying grid placed in said duct downstream of and spaced from said first rectifying net; and at least one second rectifying net having an opening ratio smaller than that of said rectifying grid, and said second rectifying net placed in said duct downstream of and spaced from said rectifying grid for readjusting a velocity of said fluid passing through a space between said rectifying grid and said second rectifying net.

6. The active noise control system according to claim 5, wherein the opening ratio of said first rectifying net and the opening ratio of said second rectifying net are equal.

7. The active noise control system according to claim 5, wherein said first rectifying net and said second rectifying net have different opening ratios.

8. The active noise control system according to claim 5, wherein said rectifying grid includes a plurality of capillaries.

* * * * *